(12) United States Patent
Wang

(10) Patent No.: US 9,165,104 B1
(45) Date of Patent: Oct. 20, 2015

(54) METHOD AND APPARATUS FOR IDENTIFYING DOUBLE PATTERNING COLOR-SEEDING VIOLATIONS

(71) Applicant: Cadence Design Systems, Inc., San Jose, CA (US)

(72) Inventor: Xiaojun Wang, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/725,945

(22) Filed: Dec. 21, 2012

(51) Int. Cl.
*G06F 17/50* (2006.01)

(52) U.S. Cl.
CPC .................. *G06F 17/5081* (2013.01)

(58) Field of Classification Search
CPC . G06F 17/50; G06F 17/5077; G06F 17/5081; G06F 2217/12; G03F 7/70466
See application file for complete search history.

(56) References Cited

U.S. PATENT DOCUMENTS

| | | | |
|---|---|---|---|
| 8,375,348 B1 | 2/2013 | Raj et al. | |
| 8,434,043 B1 * | 4/2013 | Hsu et al. | 716/113 |
| 8,448,100 B1 | 5/2013 | Lin et al. | |
| 2007/0101303 A1 | 5/2007 | Lien et al. | |
| 2010/0153905 A1 | 6/2010 | Maeda | |
| 2011/0078638 A1 | 3/2011 | Kahng et al. | |
| 2011/0193234 A1 | 8/2011 | Chen et al. | |
| 2011/0197168 A1 | 8/2011 | Chen et al. | |
| 2011/0219341 A1 | 9/2011 | Cao et al. | |
| 2011/0296360 A1 | 12/2011 | Wang et al. | |
| 2012/0124536 A1 | 5/2012 | Sharma | |
| 2012/0216157 A1 | 8/2012 | Luo et al. | |
| 2013/0024822 A1 | 1/2013 | Hsieh et al. | |
| 2013/0061186 A1 * | 3/2013 | Hsu et al. | 716/55 |
| 2013/0074018 A1 | 3/2013 | Hsu et al. | |
| 2013/0205266 A1 * | 8/2013 | Chen et al. | 716/55 |

OTHER PUBLICATIONS

U.S. Appl. No. 13/725,958, filed Dec. 21, 2012, Wang, Xiaojun.
U.S. Appl. No. 12/948,755, mailing date Mar. 4, 2013, Sharma, Karun.
U.S. Appl. No. 13/725,958, mailing date Oct. 2, 2013, Wang, Xiaojun.

* cited by examiner

*Primary Examiner* — Nha Nguyen
(74) *Attorney, Agent, or Firm* — Vista IP Law Group, LLP

(57) ABSTRACT

A method for automatically performing a double patterning (DP) color-seeding check in order to discover color-seeding violations in an IC design layout. The method of some embodiments receives a layer of the IC design layout and performs an analysis on the layer of the design layout to determine several error paths. Each error path connects two color-seeding shapes that have a color-seeding violation. For each pair of shapes that has a color-seeding violation, the method of some embodiments displays a DP color-seeding violation marker on a graphical user interface (GUI) to visually assist a user to resolve the color-seeding violation.

29 Claims, 22 Drawing Sheets

METHOD AND APPARATUS FOR IDENTIFYING DOUBLE PATTERNING COLOR-SEEDING VIOLATIONS

CROSS REFERENCE TO RELATED APPLICATION(S)

This patent application is cross related to U.S. Pat. No. 8,661,371 entitled "METHOD AND APPARATUS FOR FIXING DOUBLE PATTERNING COLOR-SEEDING VIOLATIONS" and filed on Dec. 21, 2012 with U.S. patent application Ser. No. 13/725,958.

BACKGROUND

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect the IC's electronic and circuit components.

Design engineers design ICs by transforming logical or circuit descriptions of the ICs' components into geometric descriptions, called design layouts. Design layouts typically include (1) circuit modules (i.e., geometric representations of electronic or circuit IC components) with pins and (2) interconnect lines (i.e., geometric representations of wiring) that connect the pins of the circuit modules. In this fashion, design layouts often describe the behavioral, architectural, functional, and structural attributes of the IC. To create design layouts, design engineers typically use electronic design automation ("EDA") applications. These applications provide sets of computer-based tools for creating, editing, analyzing, and verifying design layouts. The applications also render the layouts on a display device or to storage for displaying later.

Fabrication foundries ("fabs") manufacture ICs based on the design layouts using a photolithographic process. Photolithography is an optical printing and fabrication process by which patterns on a photolithographic mask (i.e., "photomask," or "mask") are imaged and defined onto a photosensitive layer coating a substrate. To fabricate an IC, photomasks are created using the IC design layout as a template. The photomasks contain the various geometries or shapes (i.e., features) of the IC design layout. The various geometries or shapes contained on the photomasks correspond to the various base physical IC elements that comprise functional circuit components such as transistors, interconnect wiring, vertical interconnect access (via) pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As more circuit features are packed into an IC design layout (e.g., manufacturing processes at feature sizes of 14 nm and below), the resolution of the photolithographic process makes it extremely difficult to fabricate the geometries or shapes on a single lithography mask. The difficulty stems from constraining factors in traditional photolithographic processes that limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain minimum width of a feature, minimum spacing between features, and other such physical manufacturing constraints.

For a particular layer of the IC fabrication process, the pitch specifies the sum of the width of a feature and the space on one side of the feature separating that feature from a neighboring feature on the same layer. The minimum pitch for a layer is the sum of the minimum feature width and the minimum spacing between features on the same layer. Depending on the photolithographic process at issue, factors such as optics and wavelengths of light or radiation restrict how small the pitch may be made before features can no longer be reliably printed to a wafer or mask. As such, the smallest size of any features that can be created on a layer of an IC is limited by the minimum pitch for the layer.

FIG. 1 illustrates a typical pitch constraint of a photolithographic process. In FIG. 1, a pitch 110 acts to constrain the spacing between printable features 120 and 130 of a design layout. While other photolithographic process factors such as the threshold 140 can be used to narrow the width 150 of the features 120 and 130, such adjustments do not result in increased feature density without adjustments to the pitch 110. As a result, increasing feature densities beyond a certain threshold is infeasible via a pitch constrained single exposure process.

To enhance the feature density, the shapes on a single layer can be manufactured on two different photolithographic masks. This approach is often referred to as "Double Patterning Lithography (DPL)" technology. FIG. 2 illustrates an example of this approach. In FIG. 2, a design layout 205 specifies three features 210-230 that are pitch constrained and thus cannot be photolithographically printed with a conventional single exposure process. Analysis of the characteristics (e.g., the band limitation) of the available photolithographic process and of the design layout 205 results in the decomposition of the design layout 205 into a first exposure 240 for printing features 210 and 230 and a second exposure 250 for printing feature 220. As such, the features 210 and 230 are assigned to a first photomask for printing during the first exposure 240 and feature 220 is assigned to a second photomask for printing during the second exposure 250.

FIG. 3 illustrates a manner of using DPL technology by sending different shapes of a layer to two different masks. Specifically, FIG. 3 illustrates sending five shapes 301-305 of a design layout 300 to two different masks. The shape pairs of the shapes 301 and 302, the shapes 302 and 303, the shapes 303 and 304, and the shapes 304 and 305 are all pitch constrained. Therefore, the two shapes of each pair must be sent to two different masks 310 and 315. Accordingly, the shapes 301 and 303 are sent to a first mask 310. That is, the shapes 301 and 303 are printed during a first exposure in order to produce contours 320. Similarly, the shapes 302, 304, and 305 are sent to a second mask 315. That is, the shapes 302, 304, and 305 are printed during a second exposure in order to produce contours 325. The resulting union of the contours 320 and 325 generates pattern 330 that is sufficient to approximately reproduce the original design layout 300.

To use DPL technology, the layout designers need to follow a set of design rules or constraints while designing the layout such that the shapes on a single design layer can be successfully fabricated using two different masks. Some available EDA tools assign two colors (e.g., red and green) to the shapes to identify the two masks with which the shapes will be fabricated. Each shape on a design layer begins with its color unassigned. The EDA tool assigns one of the two colors to each shape on the layer. Shapes that have been assigned to the same color must be spaced apart by at least a certain minimum distance specified by the design rules. Typically, the required minimum spacing between shapes assigned to the same color is greater than the required minimum spacing between two shapes with different colors because shapes with different colors are fabricated using different masks, bypassing the limitations of the single-exposure photolithographic process. In this application, the required minimum spacing between shapes assigned to the same color is referred to as a minimum same color spacing. The required minimum spacing between two shapes with different colors is referred to as a minimum spacing. Since a pitch specifies the sum of the width of a shape (i.e., feature) and the space on one side of the shape separating that feature from a neighboring shape, a minimum same color spacing is pitch minus the width of the shape in some embodiments. A specific color that is assigned to a particular shape is arbitrary. However, the assignment makes sure that the shapes adjacent to the particular shape that are spaced apart from the particular shape by less than the minimum same color spacing have different colors.

Some EDA tools model each shape in a design layout as a node in a graph. Two nodes are connected when the corresponding shapes are apart from each other at a distance smaller than the minimum same color spacing. After this modeling process, the layout is represented as clusters of graphs in which nodes are connected. Each node in a graph is assigned a color in such a way to make sure that the neighboring nodes have different colors. This is because when the neighboring nodes (e.g., a connected pair of nodes) have the same color, the corresponding shapes would violate a design rule that requires two shapes with the same color are apart from each other at a distance greater than or equal to the minimum same color spacing. However, when the nodes in a graph form a loop and there are an odd number of nodes in such graph, it is not possible to assign different colors to all pairs of nodes of the graph.

FIG. 4 illustrates an example printing error that is materialized on the physical wafer when three shapes 1-3 are sent to two different masks. Specifically, this figure shows a possible pattern 430 resulting from applying the color assignment. As shown, the shapes 1-3 are divided into two sets of shapes 410 and 415 according to the color assignment. That is, the shape 2 is sent to the first of the two masks and the shapes 1 and 3 are sent to the second mask.

Each set of shapes is printed during an exposure of a double exposure photolithographic printing process (e.g., a DPL process). That is, the shape set 410 (i.e., the shape 2) is printed during the first exposure in order to produce contours 420 and the shape set 415 is printed during the second exposure in order to produce contours 425. However, because the shape 1 and the shape 3 were too close (e.g., within the minimum same color spacing) in the pattern 405, the contour for the shape 1 and the contour for shape 2 intersect in this example, resulting in a short. The resulting union of the contours 420 and 425 generates the pattern 430. As shown, the pattern 430 did not meet the specifications within the original design layout represented by the pattern 405 in which shapes 1 and 3 are not meant to connect to each other. A printing error is thus resulted.

Double patterning (DP) is equivalent to use two colors to color the layout shapes such that a pair of shapes must be assigned opposite color if they are pitch constrained. DPL techniques are sometimes affected by the designer's desire to assume partial control of the coloring of the layout because some critical circuits, nets, or cells require control of the coloring to reduce potential randomness in variability that could occur if the foundry arbitrarily colored them. In that case, the designer assumes control over the coloring of some portion of the design, and leaves the rest to the foundry, which then decomposes the rest of the design onto different masks, either manually or with automated assistance. Those shapes that have color pre-assigned by the designer are called color-seeding shapes. Color-seeding technology is adopted to manage mask misalignment variations that could result from manufacturing variations.

The color-seeding technology may cause coloring violations in the design layout. Using color-seeding techniques creates a new challenge for users of the DP technology because they have to detect color-seeding violations while meeting other requirements of DPL techniques, as well as satisfying Design Rule Checking (DRC) and Design For Manufacturability (DFM) requirements.

BRIEF SUMMARY

Some embodiments of the invention provide a method for automatically performing a double patterning (DP) color-seeding check in order to discover color-seeding violations in an IC design layout. The method of some embodiments generates DP color-seeding violation markers that identify pairs of shapes that form color-seeding violations. For each pair of shapes that has a color-seeding violation, the method of some embodiments displays a DP color-seeding violation marker on a graphical user interface (GUI) to visually assist a user to resolve the color-seeding violation. A design solution of some embodiments moves a single shape to break the link between the pair of shapes that has a color-seeding violation to resolve the violation.

The method of some embodiments displays color-seeding violations in a circuit design layout. The method of some embodiments receives a layer of the design layout that includes several color-seeding shapes. The method of some embodiments performs an analysis on the received layer of the design layout to determine several error paths. Each error path connects two color-seeding shapes that have a color-seeding violation. For each identified error path, the method of some embodiments displays a marker to visually aid a user to resolve the color-seeding violations. The marker indicates that a pair of color-seeding shapes associated with the marker has a color-seeding violation.

In some embodiments, each path between two shapes includes a set of links. Each link connects two shapes within a threshold distance from each other. Any two shapes that are connected by a link are assigned to different masks in order to prevent printing errors. A color-seeding violation exists when there is an odd number of links on a path between two color-seeding shapes that have been assigned with the same color. In addition, a color-seeding violation exists when there is an even number of links on a path between two color-seeding shapes that have been assigned with different colors.

In order to perform the analysis to determine error paths, the method of some embodiments identifies a set of disjoint sets. Any two shapes in a disjoint set are connected to each other through at least one path. For each disjoint set, the method of some embodiments determines whether the disjoint set includes two or more color-seeding shapes. When the disjoint set is determined to have two or more color-seeding shapes, the method of some embodiments identifies a set of error paths within the disjoint set. The identified set of error paths includes all paths between two color-seeding shapes that have a color-seeding violation. For each identified error path, the method of some embodiments specifies the error path as a non-display path when the error path crosses another identified error path. In some embodiments, a non-display path is not displayed to users when the method is configured to display non-overlapped error paths only.

To identify the set of error paths with a disjoint set, the method of some embodiments identifies a set of initial search shapes from the color-seeding shapes in the disjoint set. For each identified initial search shape, the method of some embodiments identifies a path from the initial search shape to each of the other color-seeding shapes. For each identified path, the method of some embodiments determines whether the path includes a color-seeding shape pair that has a color-seeding violation. When the path includes a color-seeding shape pair that has a color-seeding violation, the method of some embodiments adds the path into the set of identified error paths. In some embodiments, determining whether the path includes a color-seeding shape pair that has a color-seeding violation includes performing a breadth-first search.

In order to identify the set of initial search shapes, the method of some embodiments assigns a color to each shape within the disjoint set based on two different coloring schemes. In some embodiments, the method selects one of the two coloring schemes as the coloring scheme for the disjoint set based on the number of color conflicts caused by each coloring scheme. In some embodiments, the coloring scheme that has fewer number of color conflicts is selected as the coloring scheme for the disjoint set. The method of some embodiments identifies color-seeding shapes that do not conform to the color assigned by the selected coloring scheme as the set of initial search shapes. In some embodiments, the two coloring schemes assign colors to shapes in the disjoint set based on the breadth-first search, where the originating shape of the breadth-first search is assigned with a color in one coloring scheme and assigned a different color in the other coloring scheme. A color conflict occurs when a color-seeding shape is assigned a color by the coloring scheme and the color is different from its pre-assigned color.

The method of some embodiments identifies multiple error paths between a color-seeding shape pair that has a color-seeding violation. In some embodiments, the method performs a union of all the shapes and links that are connected to the color-seeding shape pair. The method then identifies all the holes in the union of shapes and links. In some embodiments, a hole is a space enclosed by a loop formed by shapes and links. The method of some embodiments selects the holes that touch both shapes of the color-seeding shape pair to identify error paths. For each such hole, the method builds a sub-graph that contains only the shapes and links that interact with the hole. The method then identifies all the error paths on the sub-graph. In some embodiments, in order to identify all the error paths, the method iteratively traverses the sub-graph to identify a path between the color-seeding shape pair. After a path is identified, the method removes the links on the identified path from the sub-graph to prevent the path from being traversed again. The method then performs a new traversal on the sub-graph. In some embodiments, the method terminates the iterations when no path is identified during a traversal or two paths have been identified on the sub-graph.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

DETAILED DESCRIPTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

I. Overview

Some embodiments of the invention provide a method for automatically performing a double patterning (DP) color-seeding check in order to discover color-seeding violations in an IC design layout. The method of some embodiments generates DP color-seeding violation markers that identify pairs of shapes that form color-seeding violations. For each pair of shapes that has a color-seeding violation, the method of some embodiments displays a DP color-seeding violation marker on a graphical user interface (GUI) to visually assist a user to resolve the color-seeding violation. A design solution of some embodiments moves a single shape to break the link between the pair of shapes that has a color-seeding violation to resolve the violation.

Figure 1:
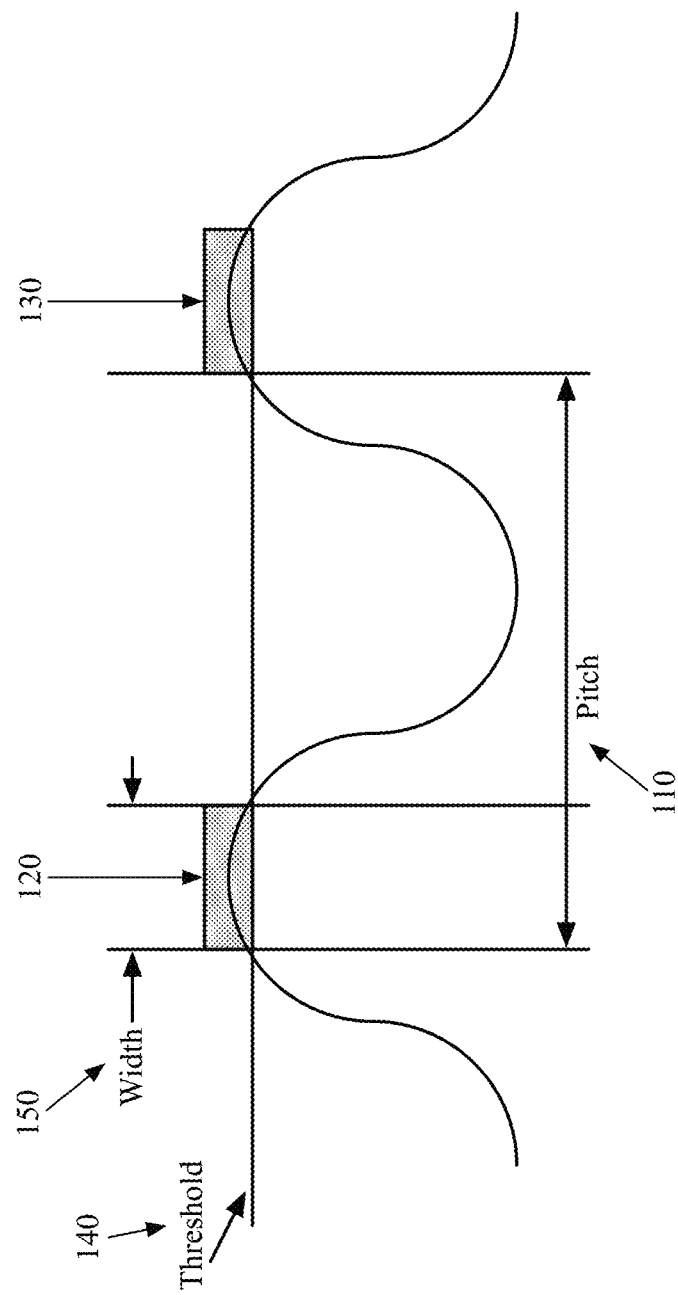
FIG. 1 illustrates a typical pitch constraint of a photolithographic process of some embodiments.
Figure 2:
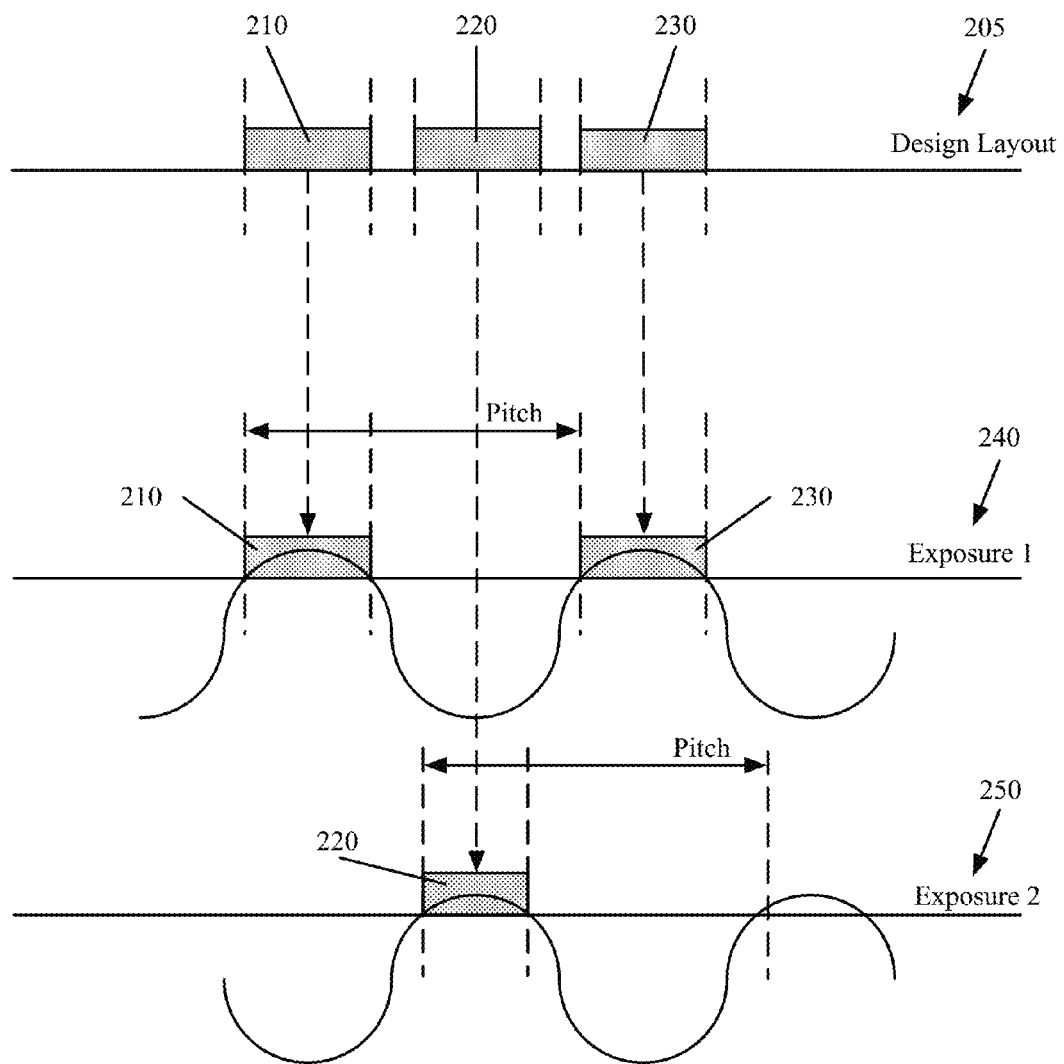
FIG. 2 illustrates an example of a multiple exposure photolithographic process of some embodiments.
Figure 3:
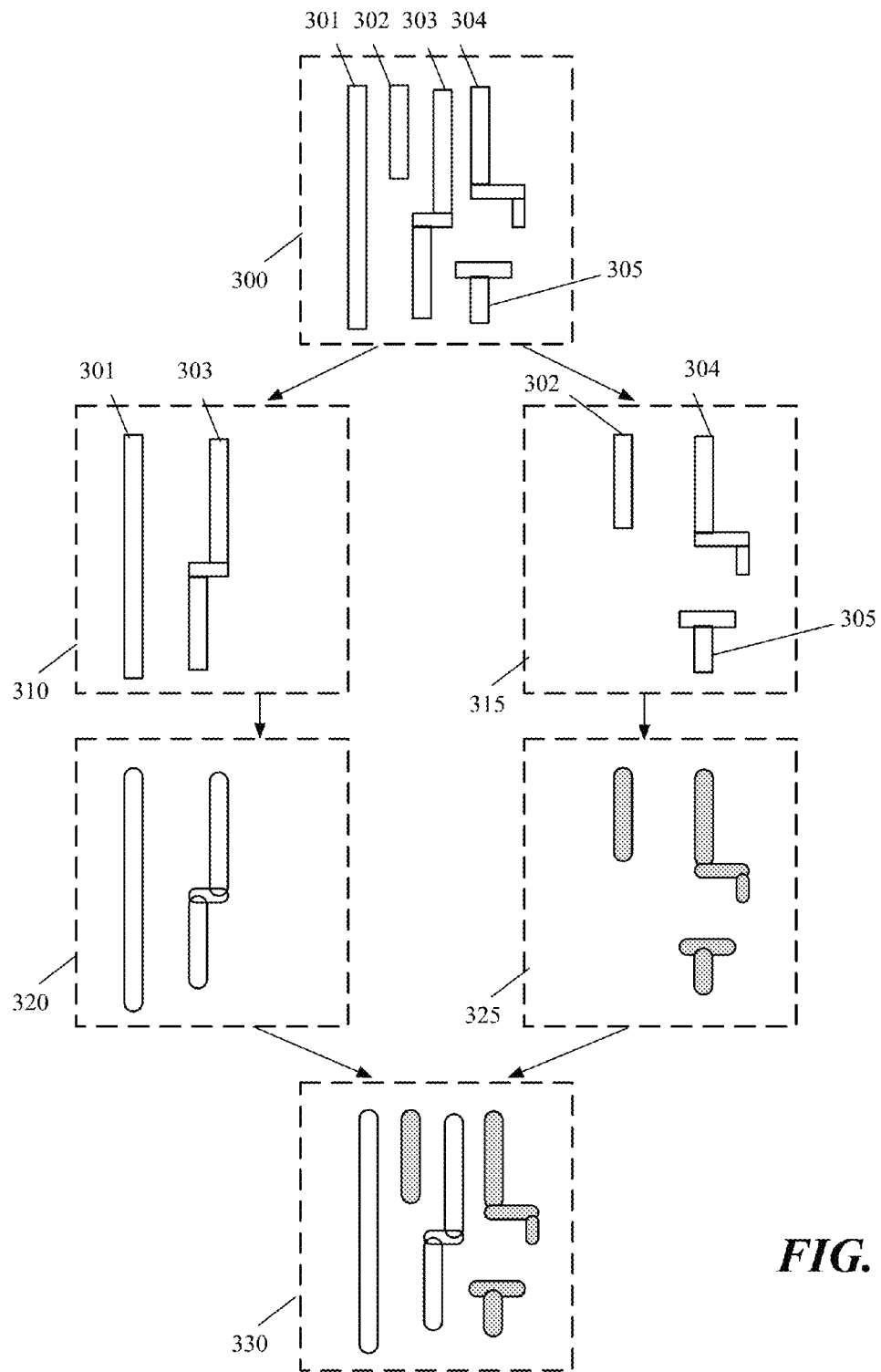
FIG. 3 illustrates an example of Double Patterning Lithography technology.
Figure 4:
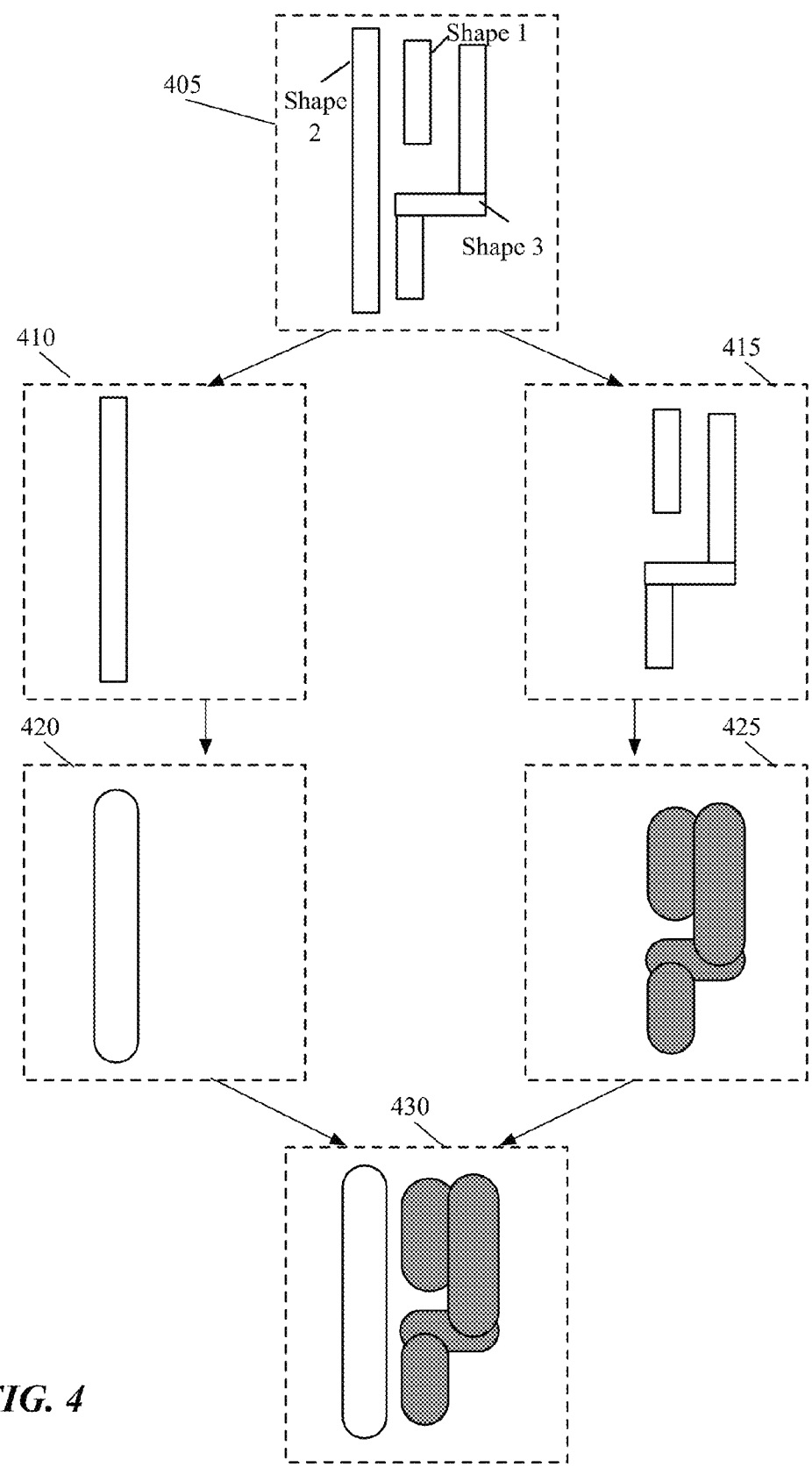
FIG. 4 illustrates an example printing error.
Figure 5:
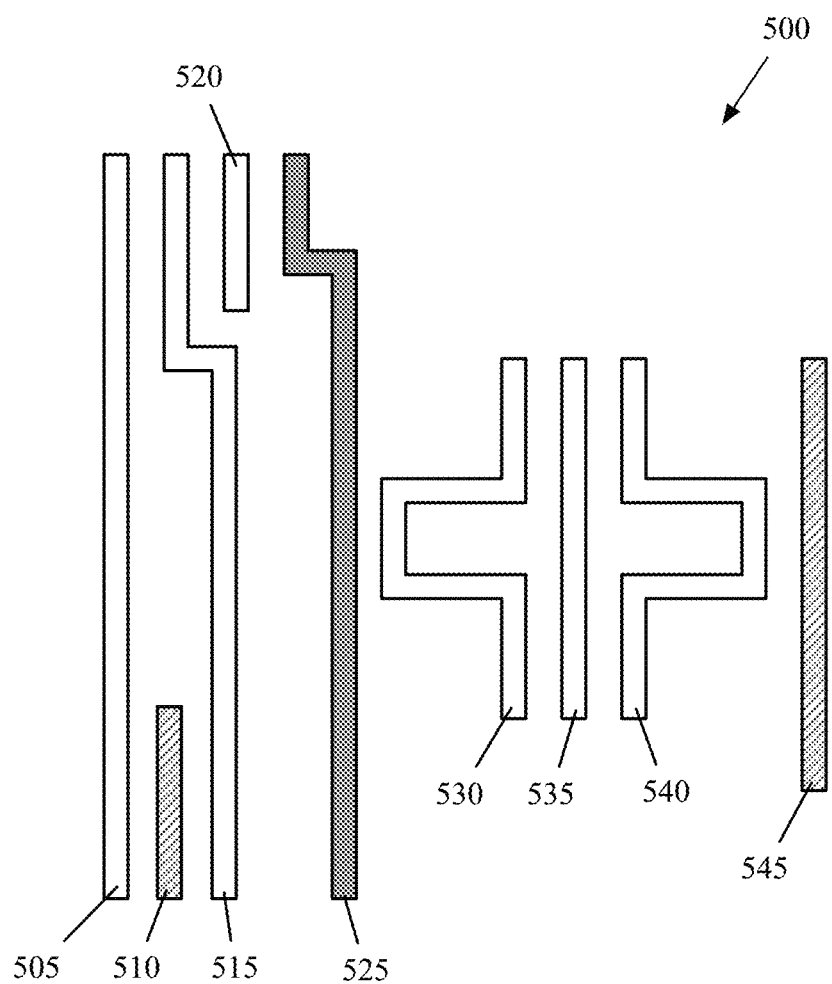
FIG. 5 illustrates an example of a design layout with color-seeding shapes.

FIG. 5 illustrates an example of a design layout with color-seeding shapes. Specifically, the design layout 500 includes nine shape 505-545. The shapes 510 and 545 are pre-assigned with a first color (illustrated in the figure as lined gray) and the shape 525 is pre-assigned with a second color (illustrated in the figure as solid gray). This means the designer has pre-assigned the shapes 510 and 545 to a first mask and the shape 525 to a second different mask. A DP decomposition tool is then be used to assign the rest of the shapes onto one of these two masks. A shape is referred to as a node. In the description that follows, the term "shape" and "node" will be used interchangeably.

Figure 6:
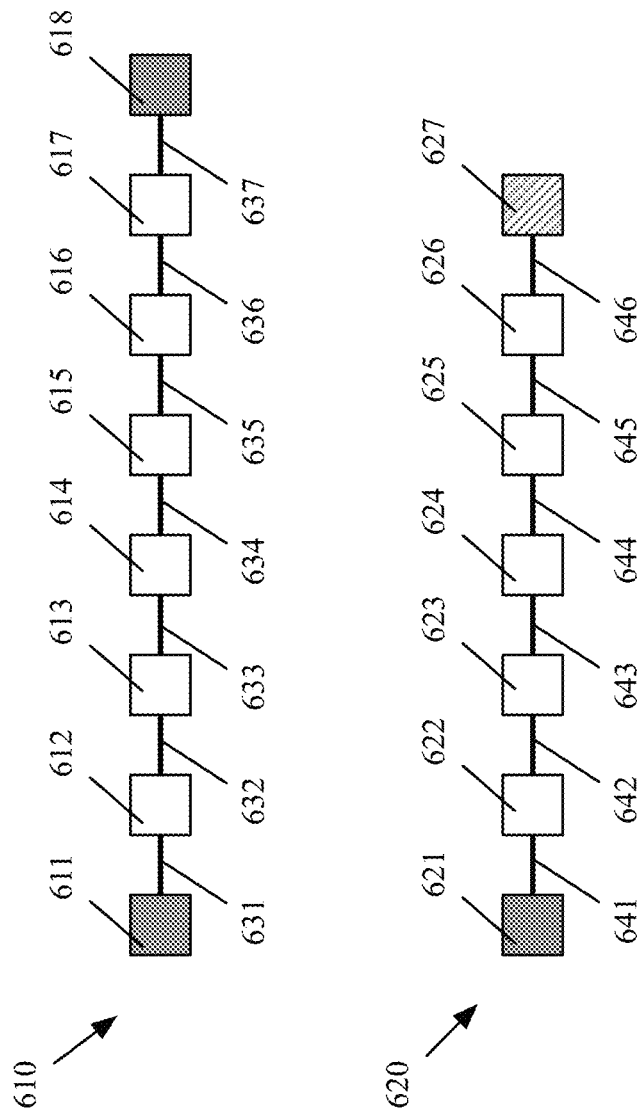
FIG. 6 illustrates two scenarios of color-seeding violations.

The color-seeding technology may cause coloring violations in the design layout. FIG. 6 illustrates two scenarios of color-seeding violations. Specifically, this figure shows two paths 610 and 620. The path 610 includes eight shapes 611-618 connected by seven links 631-637. The path 620 includes seven shapes 621-627 connected by six links 641-646. Each link connects two shapes that are pitch constrained. Therefore, two shapes connected by a link should be assigned different colors in order to prevent printing errors.

The path 610 includes two pre-colored shapes 611 and 618 that are pre-assigned with a first color (illustrated in the figure as solid gray). This means the two shapes are pre-assigned to the same mask. Because the shape 611 is pre-colored with the first color, its neighboring shape 612 should be assigned to a second different color (illustrated in the figure as lined gray). Assuming there are only two masks available for assignment in some embodiments, one is represented by the first color and the other is represented by the second color. The shape 613 should be assigned the first color because it is connected to the shape 612 through the link 632. Similarly, the shapes 615 and 617 should be assigned the first color. Because the shape 618 is connected to the shape 617 through the link 637, the shape 618 should be assigned a color different than the color assigned to the shape 637. Therefore, the shape 618 should be assigned the second color. However, this is in conflict with the pre-assigned color of the shape 618, which is the first color. Therefore, there is a color-seeding violation between the pre-colored shapes 611 and 618. When two seeding shapes pre-assigned with the same color have an odd number of links in between, the method of some embodiments determines that the pair of shapes causes a color-seeding violation. However, when two seeding shapes pre-assigned with the same color have an even number of links in between, the method of some embodiments determines that the pair of shapes does not cause a color-seeding violation.

The path 620 includes two pre-colored shapes 621 and 627. The shape 621 is assigned the first color (illustrated in the figure as solid gray) and the shape 627 is assigned the second color (illustrated in the figure as lined gray). This means the two shapes are pre-assigned to different masks. Because the shape 621 is pre-colored with the first color, its neighboring shape 622 should be assigned to a different color, e.g., the second color. The shape 623 should be assigned the first color because it is connected to the shape 622 through the link 642. Similarly, the shapes 625 and 627 should be assigned the first color. However, this is in conflict with the pre-assigned color of the shape 627, which is the second color. Therefore, there is a color-seeding violation between the pre-colored shapes 621 and 627. When two seeding shapes assigned with different colors have an even number of links in between, the method of some embodiments determines that the pair of shapes causes a color-seeding violation. However, when two seeding shapes assigned with different colors have an odd number of links in between, the method of some embodiments determines that the pair of shapes does not cause a color-seeding violation.

In some embodiments, a DP color-seeding violation marker contains information regarding a DP color-seeding violation in a design layout. In some embodiments, the information contained in the marker includes the coordinates of vertexes of a geometric shape that represents the marker in the design layout, the identifiers that identify the shapes that are forming the color-seeding violation, the colors assigned to the violating shapes, the coordinates of the violating shapes, etc. A DP color-seeding violation marker is represented in some embodiments as a path in the design layout. The path representing the marker will connect the two violating shapes in some embodiments. Throughout this application, a "marker" refers to the path that represents the marker as well as the data that contain the information regarding the violation, for simplicity of discussion.

Figure 7:
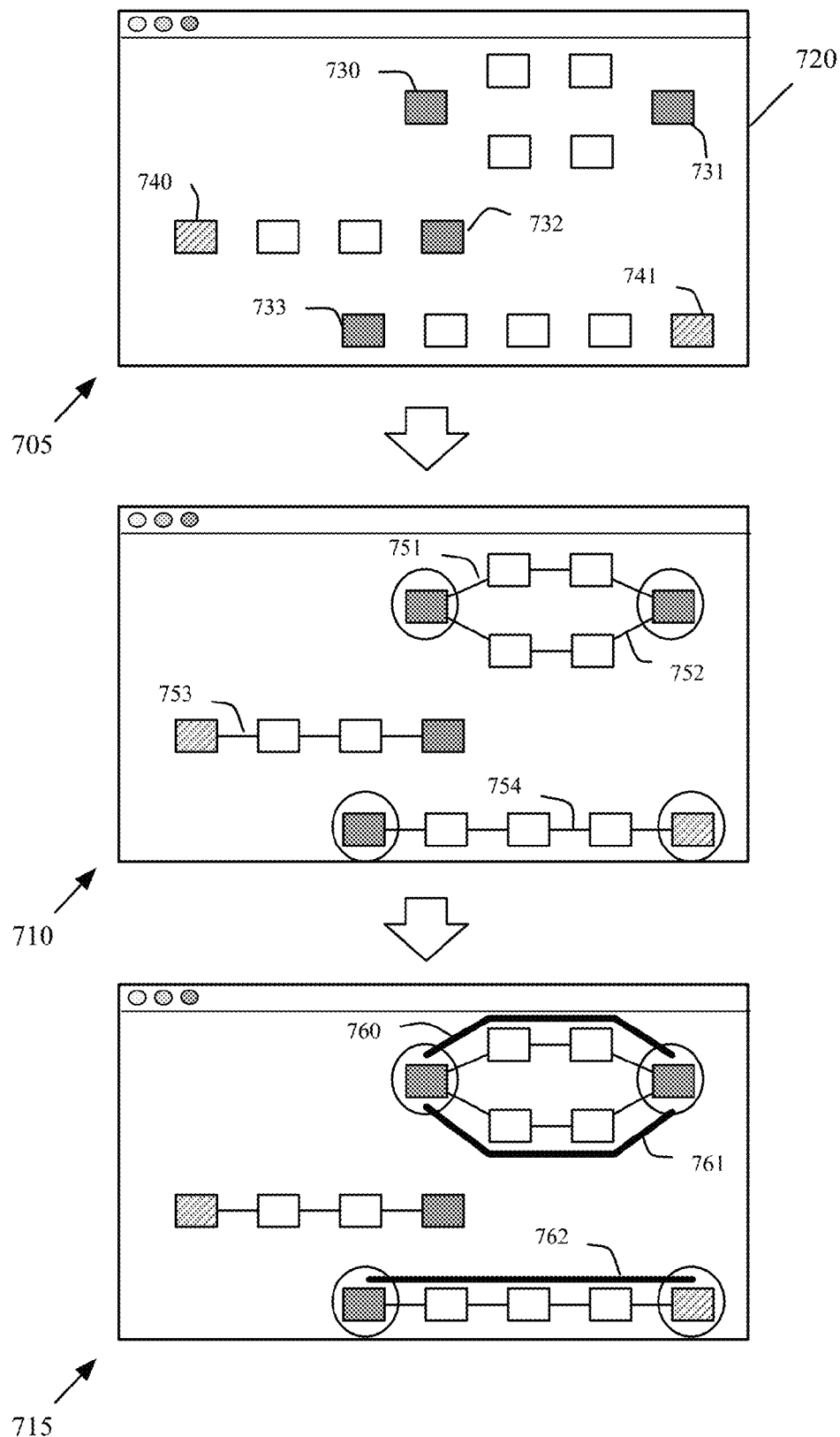
FIG. 7 illustrates an example of a GUI for displaying DP color-seeding violation markers.

FIG. 7 illustrates an example of a GUI for displaying DP color-seeding violation markers. Specifically, this figure illustrates in three different stages 705, 710, and 715 that a design layout with color-seeding shapes is being checked to identify color-seeding violations. The design layout is displayed in the GUI 720.

In the first stage 705, the design layout is displayed as a set of isolated shapes, some of which are pre-colored. There is no link between any of the shapes. Four shapes 730-733 are pre-assigned with a first color (illustrated in the figure as solid gray), which means they are pre-assigned to a first mask. Two shapes 740 and 741 are pre-assigned with a second color (illustrated in the figure as lined gray), which means they are pre-assigned to a second mask.

In the second stage 710, the GUI 720 displays a link for any two shapes that are pitch constrained. As mentioned above, a link between two shapes indicates that the two shapes are within the minimum same color spacing of each other. There is a path between any two shapes if they are connected to each other through one or more of such links. One or more paths between two pre-colored shapes could cause a color-seeding violation. As illustrated in the figure, the color-seeding shape 730 connects to the color-seeding shape 731 through two paths 751 and 752. Because each of the two paths 751 and 752 includes three (i.e., an odd number) links and the shapes 730 and 731 are pre-assigned the same color, the pre-colored shapes 730 and 731 form a color-seeding violation. As a result, the GUI 720 generates markings (e.g., circles enclosing the nodes representing the shapes 730 and 731) to indicate the shapes 730 and 731 as an error shape pair. The color-seeding shape 740 connects to the color-seeding shape 732 through the path 753. Because the paths 753 includes three (i.e., an odd number) links and the shapes 740 and 732 are pre-assigned different colors, the pre-colored shapes 740 and 732 do not cause a color-seeding violation. The color-seeding shape 733 connects to the color-seeding shape 741 through the path 754. Because the paths 754 includes four (i.e., an even number) links and the shapes 733 and 741 are pre-assigned different colors, the pre-colored shapes 733 and 741 cause a color-seeding violation. As a result, the shapes 733 and 731 are circled to flag them as an error shape pair.

In the third stage 715, the GUI 720 generates a color-seeding violation marker for each path that contains a color-seeding violation. Because a color-seeding violation between two pre-colored shapes could be caused by multiple paths that connect them, an EDA application may generate multiple color-seeding violation markers for a pair of pre-colored shapes. As illustrated in the figure, a color-seeding violation marker 760 is generated for the path 751 and a color-seeding violation marker 761 is generated for the path 752. Therefore, there are two color-seeding violation markers generated for the pair of pre-colored shapes 730 and 731. A color-seeding violation marker 762 is generated for the path 754 to flag the error path between the pre-colored shapes 733 and 741. Once the color-seeding violation markers are displayed in the GUI 720, a user is able to make informed decision as to how to resolve these violations. It is to be noted that the color-seeding markers do not have to be in the forms that are depicted as in this figure. Any geometric shapes will suffice.

Figure 8:
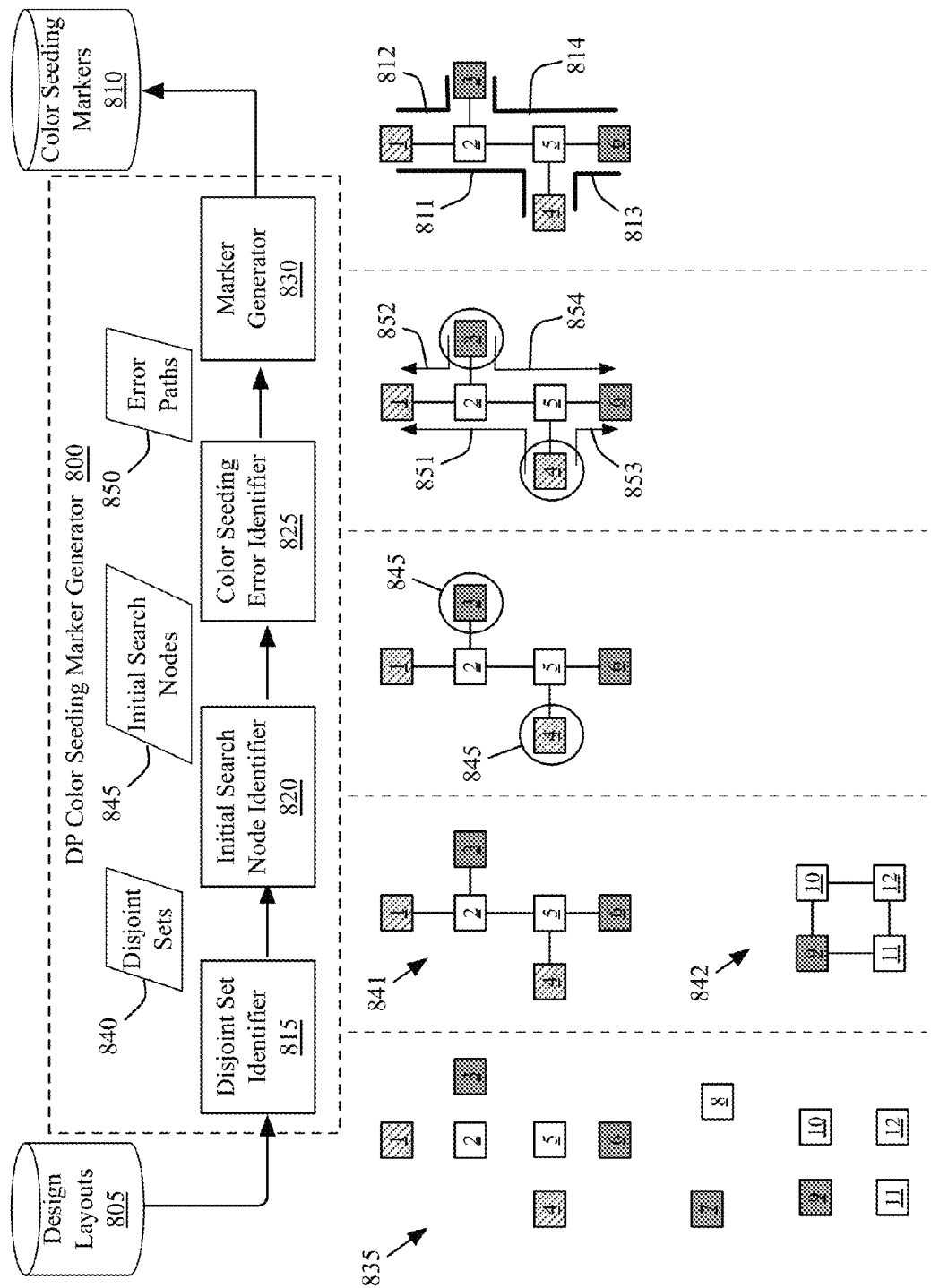
FIG. 8 conceptually illustrates a DP color-seeding marker generator of some embodiments.

FIG. 8 conceptually illustrates a DP color-seeding marker generator 800 of some embodiments. Specifically, the figure illustrates an example of generating color-seeding markers that indicate DP color seeding violations. The DP color seeding marker generator 800 retrieves design layouts and generates color-seeding markers based on the design layouts. In some embodiments, the DP color-seeding marker generator 800 is a stand-alone software application, while in other embodiments the DP color-seeding marker generator 800 is part of an EDA application.

This figure illustrates a design layouts repository 805, the DP color-seeding marker generator 800, and a color-seeding markers repository 810. The DP color-seeding marker generator 800 includes a disjoint set identifier 815, an initial search node identifier 820, a color seeding error identifier 825, and a marker generator 830. This figure also illustrates a design layout 835. The design layout 835 includes twelve shapes 1-12 among other shapes (not shown). The shapes 1 and 4 are pre-assigned with a first color (illustrate in the figure as lined gray) and the shapes 3, 6, 7, and 9 are pre-assigned with a second color (illustrated in the figure as solid gray). This means the designer has pre-assigned the shapes 1 and 4 to a first mask and the shapes 3, 6, 7, and 9 to a second different mask.

The design layouts repository 805 stores design layouts. The design layouts repository 805 in some embodiments receives the design layouts from design software applications, which design engineers use to generate the design layouts and assign colors. In some embodiments, the design layouts stored in the design layouts repository 805 are in a database file format, e.g., GDS II stream format (GDSII).

The disjoint set identifier 815 receives or retrieves a design layout from the design layouts repository 805 and identifies all disjoint set of shapes 840 in the design layout. A disjoint set of shapes is a set of shapes in which each shape is within a threshold distance from at least one other shape in the design layout. The disjoint set identifier 815 of some embodiments uses a graph in which the shapes are represented as nodes. The disjoint set identifier 815 connects a pair of nodes with a link (e.g., a line or an edge) in the graph when the pair of shapes represented by the pair of nodes are within the threshold distance (e.g., a minimum pitch). In a graph representing a disjoint set, a node is connected to another node through one or more links. A node is directly connected to another node when these two nodes are connected by a single link. For instance, the disjoint set identifier 815 receives the design layout 805 and identifies two disjoint sets 841 and 842. The disjoint set 841 includes the shapes 1-6 and the disjoint set 842 includes the shapes 9-12. The shapes 7 and 8 do not belong to any disjoint set because they are not within a threshold distance from any other shape in the design layout.

In some embodiments, the initial search node identifier 820 receives the disjoint sets 840 and identifies a set of initial search nodes 845 for each disjoint set that has at least two color-seeding nodes. An initial search node is a node that acts as a starting point for performing further search in order to identify pairs of color-seeding nodes that have color-seeding violations and to identify the error paths that cause the color-seeding violations. For instance, the initial search node identifier 820 receives two disjoint sets 841 and 842. Because the disjoint set 842 has only one color-seeding node, i.e., the shape 9, the initial search node identifier 820 does not process this disjoint set. The other disjoint set 841 includes two shapes 1 and 4 pre-assigned with a first color (illustrated in the figure as lined gray) and two shapes 3 and 6 pre-assigned with a second color (illustrated in the figure as solid gray). The initial search node identifier 820 processes the disjoint set 841 and flags the shapes 3 and 4 as initial search nodes. In some embodiments, the identification of initial search nodes in a disjoint set involves applying two different coloring schemes to all shapes in the disjoint set and selecting a coloring scheme that involves fewer number of color-seeding nodes that do not conform to the coloring scheme. Any color-seeding node that does not conform to the selected coloring scheme is flagged as an initial search node. The processing of a disjoint set to identify initial search nodes will be further described below by reference to FIGS. 10 and 11.

The color seeding error identifier 825 receives a set of initial search nodes 845 from the initial search node identifier 820. The color seeding error identifier 825 then uses each of the received initial search nodes as a starting point to traverse the disjoint set to reach other color-seeding nodes in the disjoint set. In some embodiments, the color seeding error identifier 825 traverses the disjoint set by using the breadth-first search. However, it will be recognized by one skilled in the art that other search methods, e.g., depth-first search, can be used to traverse the disjoint set. In this application, the color-seeding node where a search starts is called a source node and a color-seeding node reached by the search is called a destination node. If the path between the source node and the destination node contains a color-seeding violation, the source node and the destination node forms an error node pair and the path between the error node pair becomes an error path. For instance, the color seeding error identifier 825 traverses the disjoint set 841 using the breadth-first search. When the search starts from the shape 3, the color seeding error identifier 825 identifies two error paths 852 and 854. When the search starts from the shape 4, the color seeding error identifier 825 identifies two error paths 851 and 853.

The marker generator 830 receives the identified error paths 850 and generates color-seeding markers to store in the repository 810 for further rendering on a display device to visually assist the users of design solutions to recognize the color-seeding violations. For instance, the marker generator 830 generates four markers 811-814 for the identified error paths 851-854. It is to be noted that the color-seeding markers do not have to be in the forms that they are depicted as in the figures. Any geometric shapes will suffice. Several more detailed embodiments of the DP color-seeding marker generator are described below in Section IV.

Figure 9:
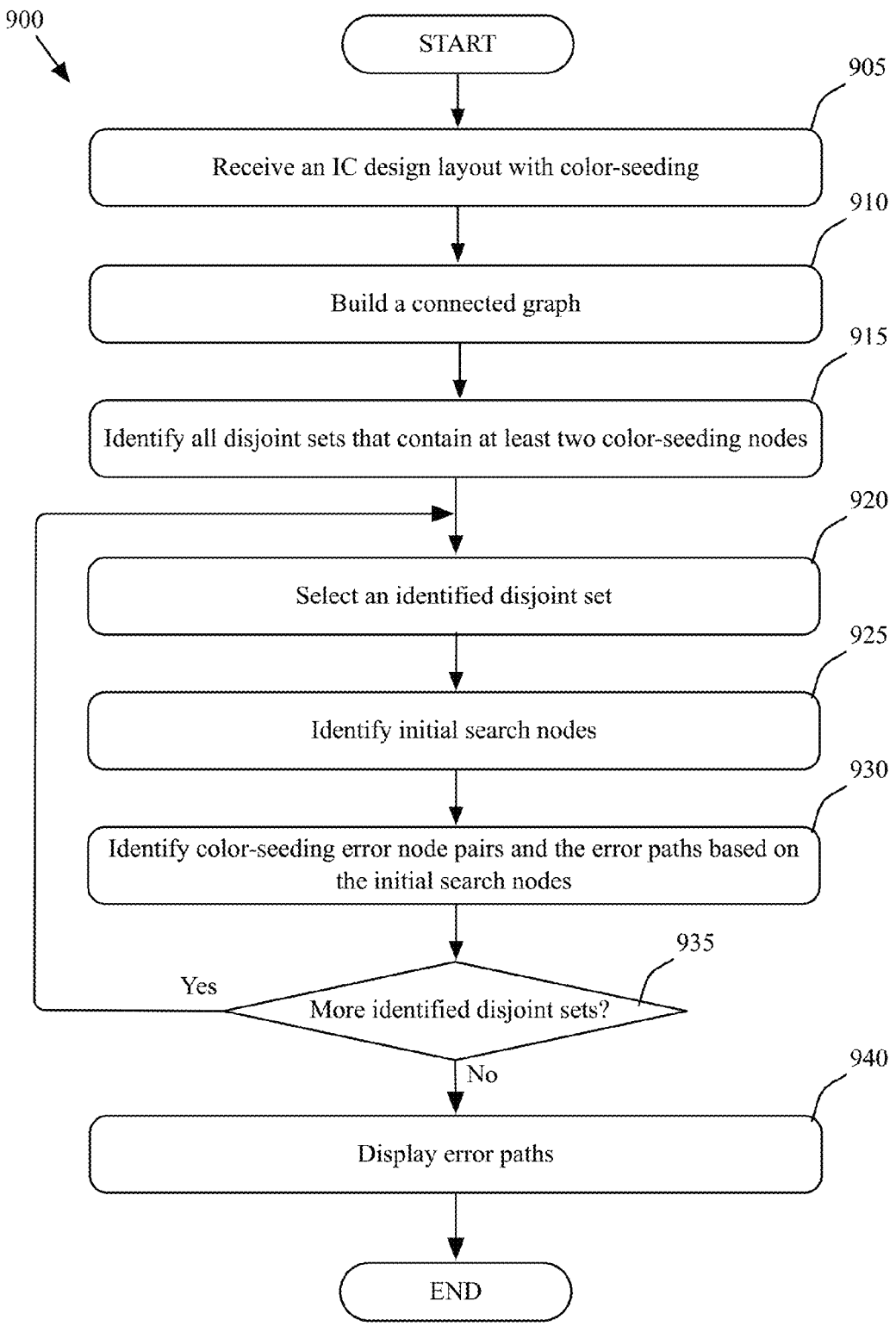
FIG. 9 conceptually illustrates a process performed by some embodiments to generate color-seeding markers.

An example operation of the DP color-seeding marker generator 800 will now be described by reference to FIG. 9. FIG. 9 conceptually illustrates a process 900 performed by some embodiments to generate color-seeding markers to aid users to recognize the color-seeding violations. As shown in FIG. 9, the process 900 begins by receiving (at 905) an IC design layout with color-seeding shapes, which means some shapes in the IC design have been pre-assigned to masks by the designer. FIG. 8 illustrates that the DP color-seeding marker generator 800 retrieves the IC design layout 835 from the design layout repository 805.

Next, the process 900 builds (at 910) a connected graph based on the IC design layout retrieved at 905. The process connects a pair of nodes with a link (e.g., a line or an edge) in the graph when the pair of shapes represented by the pair of nodes is within the threshold distance (e.g., a minimum pitch). The process 900 then identifies (at 915) all disjoint sets with the IC design layout that contain at least two color-seeding nodes. In other words, the process eliminates isolated nodes or any disjoint set that has only one color-seeding node from further processing. In the example of FIG. 8, the disjoint set identifier 815 receives the design layout 835 and builds a connected graph based on the design layout. The disjoint set identifier 815 then identifies disjoint sets 841 and 842 while eliminating isolated shapes 7 and 8. The initial search node identifier 820 then eliminates the disjoint set 842 because it has only one color-seeding node, i.e., the shape 9. As a result, only the disjoint set 841 is left for further processing.

Back to FIG. 9, the process 900 then selects (at 925) an identified disjoint set. Next, the process 900 identifies (at 925) a set of initial search nodes. An initial search node is a node that acts as a starting point for performing further search in order to identify pairs of color-seeding nodes that have color-seeding violations and to identify the error paths that cause the color-seeding violations. FIG. 8 illustrates that the initial search node identifier 820 processes the disjoint set 841 and identifies two initial search nodes 845.

The process 900 identifies (at 930) color-seeding error node pairs and the error paths between them by traversing the disjoint set based on the set of initial search nodes identified at 925. In some embodiments, the process 900 traverses the disjoint set by using the breadth-first search originated from each initial search node. FIG. 8 illustrates that the color seeding error identifier 825 traverses the disjoint set 841 using the breadth-first search. When the search starts from the shape 3, the color seeding error identifier 825 identifies two error paths 852 and 854. When the search starts from the shape 4, the color seeding error identifier 825 identifies two error paths 851 and 853.

Next, the process 900 determines (at 935) whether there is more identified disjoint sets. When the process determines that there is more disjoint sets for processing, the process 900 loops back to 920 to select the next identified disjoint set to process. When the process determines that there is no more disjoint sets for processing, the process 900 displays (at 940) the identified error paths for all the disjoint sets on the IC design layout. In some embodiments, the process generates a set of color-seeding markers in order to display those identified error paths. In the example of FIG. 8, the marker generator 830 generates four markers 811-814 for the identified error paths 851-854. The process 900 then ends.

One of ordinary skill in the art will recognize that the process 900 is a conceptual representation of the operations used to generate color-seeding markers in order to assist users to recognize the color-seeding violations in a design layout.

The specific operations of the process 900 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 900 is performed by one or more software applications that execute on one or more computers. It is to be noted that the color-seeding markers do not have to be in the forms that they are depicted as in the figures. Any geometric shapes will suffice.

Several more detailed embodiments of DP color-seeding marker generator are described in the sections below. Section II describes a method of some embodiments that identifies a set of initial search nodes. Next, Section III describes a method of some embodiments that uses initial search nodes to identify color-seeding violations. Section IV describes a method of some embodiments that displays identified error paths. Finally, Section V describes an electronic system that implements some embodiments of the invention.

II. Identification of Initial Search Nodes

Figure 10:
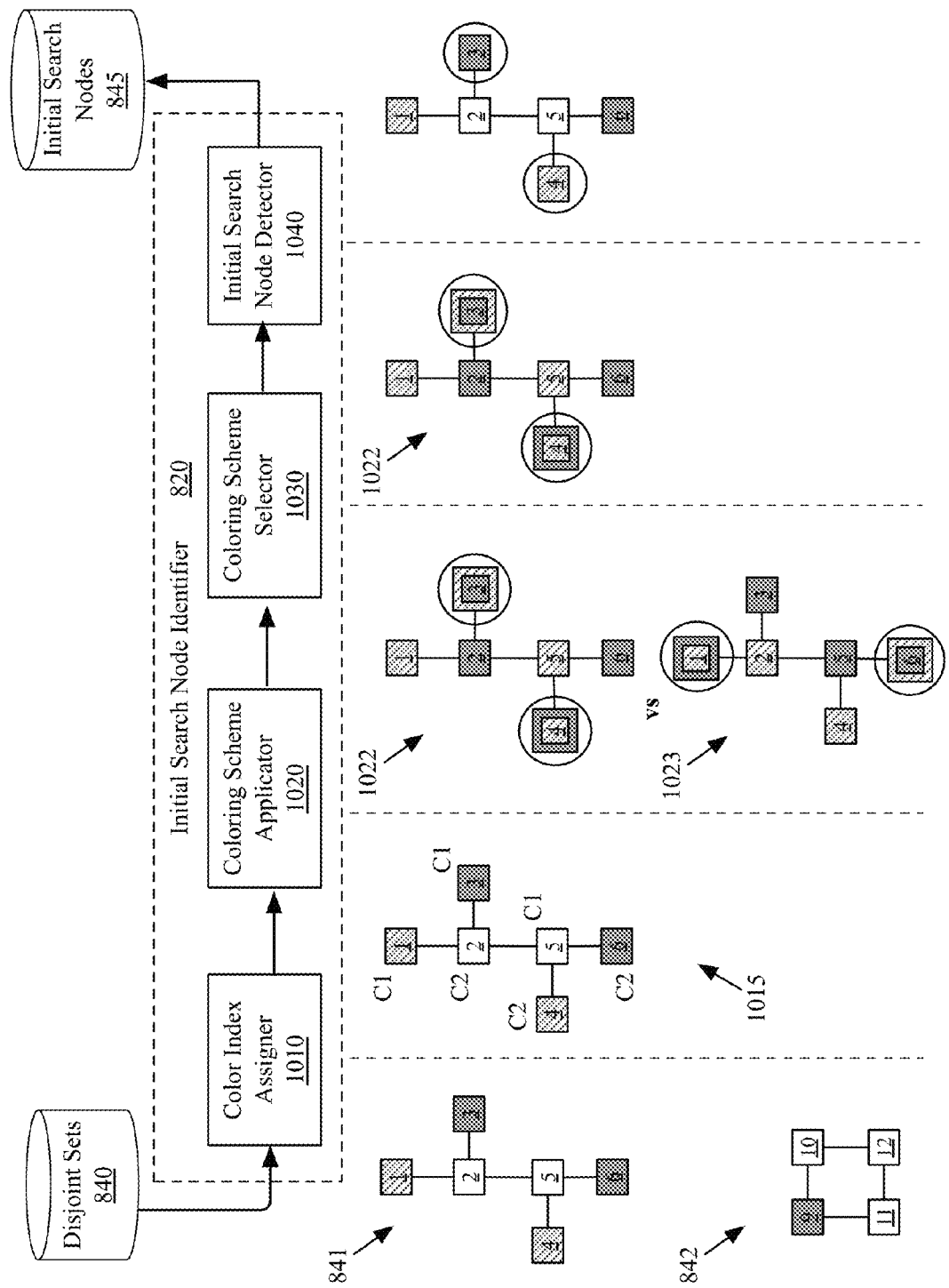
FIG. 10 conceptually illustrates an initial search node identifier of some embodiments.

FIG. 10 conceptually illustrates an initial search node identifier 820 of some embodiments. Specifically, the figure illustrates an example of identifying a set of initial search nodes that will act as starting points for performing further searches in order to identify pairs of color-seeding nodes that have color-seeding violations and to identify the error paths that cause the color-seeding violations. The initial search node identifier 820 retrieves disjoint sets and identifies the set of initial search nodes based on the retrieved disjoint sets.

This figure illustrates a set of disjoint sets 840, the initial search node identifier 820, and the identified initial search nodes 845. The initial search node identifier 820 includes a color index assigner 1010, a coloring scheme applicator 1020, a coloring scheme selector 1030, and an initial search node detector 1040. In some embodiments, the initial search node identifier 820 receives the disjoint sets 840 and identifies a set of initial search nodes 845 for each disjoint set that has at least two color-seeding nodes. The disjoint sets 840 includes two disjoint sets of shapes 841 and 842. The disjoint set 841 includes six shapes 1-6, in which the shapes 1 and 4 are pre-assigned with a first color (illustrated in the figure as lined gray) and the shapes 3 and 6 are pre-assigned with a second color (illustrated in the figure as solid gray). The disjoint set 842 includes four shapes 9-12, in which shape 9 is pre-assigned with the second color. This means the designer has pre-assigned the shapes 1 and 4 to a first mask and the shapes 3, 6, and 9 to a second different mask.

The color index assigner 1010 receives the disjoint sets 840 and assigns a color index to each node in any disjoint set that contains at least two color-seeding nodes. Because the disjoint set 842 has only one color-seeding node, i.e., the shape 9, the color index assigner 1010 does not process the disjoint set 842. The color index represents the result of the colorization, i.e., the result of assigning shapes in a disjoint set to different masks. If a node at one end of a link is assigned to a first color, the node at another end of the link should be assigned to a second different color, and vice versa. In some embodiments, the color index assigner 1010 uses the breadth-first search method to assign color index to each node in the disjoint set. For instance, the color index assigner 1010 traverses the disjoint set 841 by using the breadth-first search and generates a disjoint set 1015 that has every node assigned a color index. This breadth-first search starts from the shape 1, which is assigned a color index C1. The search then traverses to the shape 2, which is assigned a color index C2. The search next goes to the shapes 5 and 3, which are assigned the color index C1. The search then traverses to the shapes 4 and 6, which are assigned the color index C2. After the search is completed, every node in the disjoint set is assigned a color index, either C1 or C2, as illustrated in the disjoint set 1015.

In some embodiments, the coloring scheme applicator 1020 receives a disjoint set of nodes that have been assigned color indexes and applies two different coloring schemes to nodes in the disjoint set. For the first coloring scheme, the coloring scheme applicator 1020 assigns the first color to nodes with color index C1 and assigns the second color to nodes with color index C2. For the second coloring scheme, the coloring scheme applicator 1020 assigns the second color to nodes with color index C1 and assigns the first color to nodes with color index C2. For instance, the coloring scheme applicator 1020 receives the disjoint set 1015 that has all nodes assigned a color index. For the first coloring scheme 1022, the coloring scheme applicator 1020 assigns the first color to the shapes 1, 3, and 5 and assigns the second color to the shapes 2, 4, and 6 because the shapes 1, 3, and 5 are assigned the color index C1 and the shapes 2, 4, and 6 are assigned the color index C2 by the color index assigner 1010. As illustrated in the coloring scheme 1022, the shape 3 is pre-assigned with the second color but is assigned with the first color by the first coloring scheme 1022. Therefore, there is a color conflict on the shape 3 for the first coloring scheme. Similarly, the shape 4 has a color conflict because it is pre-assigned with the first color but is assigned with the second color by the first coloring scheme 1022. For the second coloring scheme 1023, the coloring scheme applicator 1020 assigns the second color to the shapes 1, 3, and 5 and assigns the first color to the shapes 2, 4, and 6. The shapes 1 and 6 have color conflicts because their pre-assigned colors do not conform to the colors assigned according to the second coloring scheme 1023.

The coloring scheme selector 1030 reviews two different coloring schemes for a disjoint set and selects one coloring scheme with less number of color conflicts as the coloring scheme for the disjoint set. In some embodiments, for instance, the coloring scheme selector 1030 receives two coloring schemes 1022 and 1023. As discussed above, each of the coloring schemes 1022 and 1023 has two color conflicts. Thus the two coloring schemes have the same number of color conflicts and either one of them can be selected as the coloring scheme for the disjoint set. For instance, as illustrated in FIG. 10, the coloring scheme 1022 is selected as the coloring scheme for the disjoint set 1015.

The initial search node detector 1040 receives a selected coloring scheme and generates a set of initial search nodes by detecting any color-seeding node having a pre-assigned color that does not conform to the selected coloring scheme. For example, the initial search node detector 1040 receives the selected coloring scheme 1022. Because the coloring scheme 1022 has two color-seeding shapes 3 and 4 that do not conform to the color assigned to them by the coloring scheme, the shapes 3 and 4 are identified to be the initial search nodes 845 for the disjoint set 841. The initial search nodes 845 act as starting points for performing further searches in order to identify pairs of color-seeding nodes that have color-seeding violations and to identify the error paths between them that cause the color-seeding violation. The identified initial search nodes 845 will be used by the color seeding error identifier 825 described above by reference to FIG. 8.

In this example, the color index assigner 1010 uses the breadth-first search method to assign a color index to each node in the disjoint set. However, one of ordinary skill in the art will realize that the color index assigner 1010 may use other search methods, e.g., depth-first search etc., to assign color indexes to nodes in the disjoint set.

Figure 11:
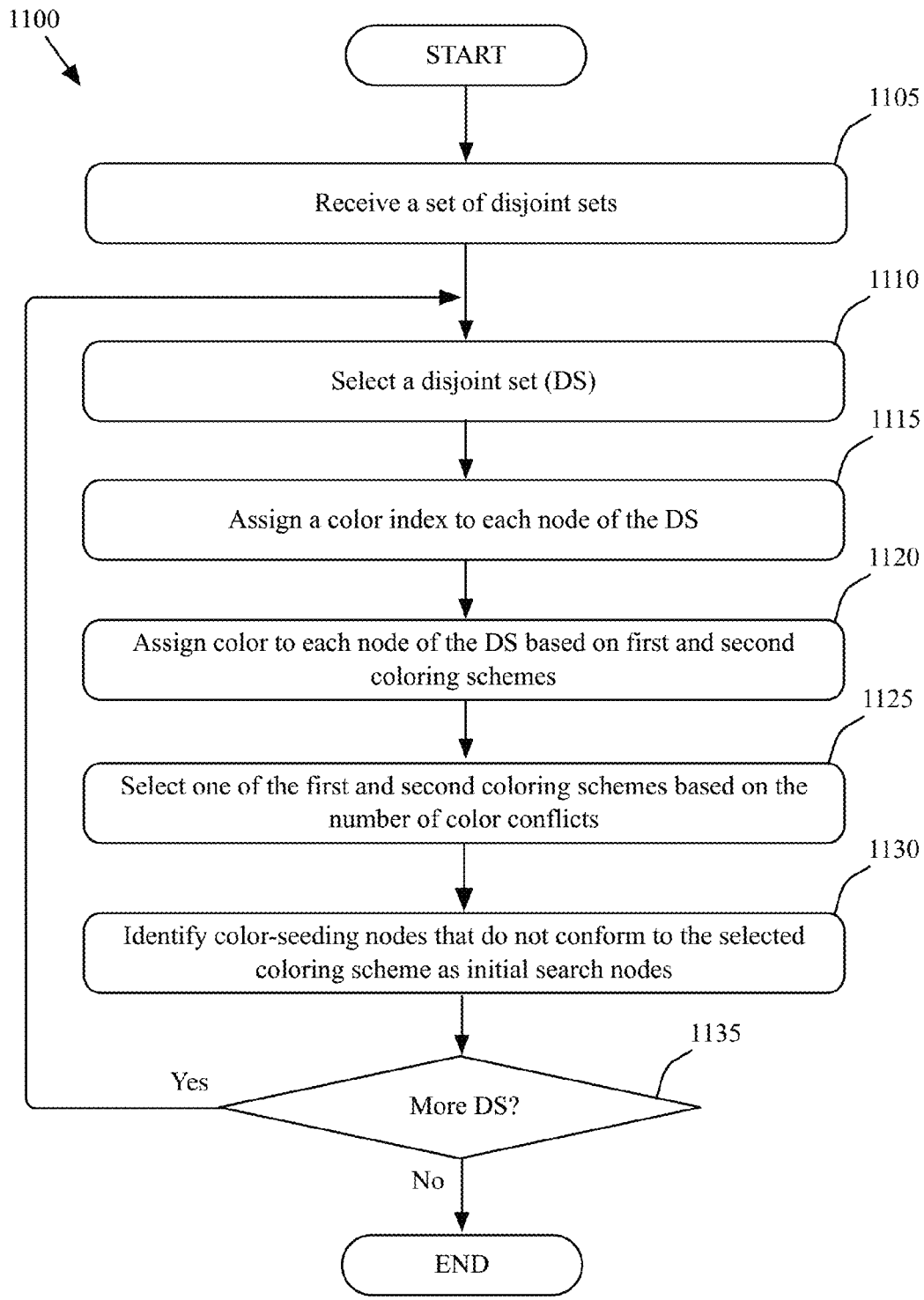
FIG. 11 conceptually illustrates a process performed by some embodiments to identify the initial search nodes by applying different coloring schemes.

An example operation of the initial search node identifier 820 will now be described by reference to FIG. 11. FIG. 11 conceptually illustrates a process 1100 performed by some embodiments to identify initial search nodes by applying different coloring schemes. In some embodiments, the DP color-seeding marker generator 800 performs the process 1100. The process 1100 begins by receiving (at 1105) a set of disjoint sets. As described above, FIG. 10 illustrates two example disjoint sets 841 and 842 that the initial search node identifier 820 has received.

Next, the process 1100 selects (at 1110) a disjoint set to identify initial search nodes. For instance, the process selects the disjoint set 841, as illustrated in FIG. 10. The process 1100 then assigns (at 1115) a color index to each node of the selected disjoint set. The color index represents the result of the colorization, i.e., the result of assigning shapes in a disjoint set to different masks. If a node at one end of a link is assigned to a first color, the node at another end of the link should be assigned to a second different color, and vice versa. FIG. 10 illustrates that the color index assigner 1010 receives the disjoint set 841 and assigns a color index to each node in the disjoint set. In some embodiments, the color index assigner 1010 traverses the disjoint set 841 using a breadth-first search. The result is the disjoint set 1015 that has every node assigned a color index, which is either C1 or C2.

The process 1100 then assigns (at 1120) a color to each node of the selected disjoint set based on two different coloring schemes. FIG. 10 illustrates that the coloring scheme applicator 1020 receives a disjoint set 1015 that have been assigned color indexes and applies two different coloring schemes 1022 and 1023 to all nodes in the disjoint set. For the first coloring scheme 1022, the coloring scheme applicator 1020 assigns the first color (illustrated as lined gray) to the shapes 1, 3, and 5 and assigns the second color (illustrated as solid gray) to the shapes 2, 4, and 6 because the shapes 1, 3, and 5 are assigned the color index C1 and the shapes 2, 4, and 6 are assigned the color index C2 by the color index assigner 1010. For the second coloring scheme 1023, the coloring scheme applicator 1020 assigns the second color to the shapes 1, 3, and 5 and assigns the first color to the shapes 2, 4, and 6.

Next, the process 1100 selects (at 1125) one of the two coloring schemes based on the number of color conflicts that each coloring schemes causes. Specifically, the process reviews two different coloring schemes for a disjoint set and selects one coloring scheme with less number of color conflicts as the coloring scheme for the selected disjoint set. In some embodiments, the coloring scheme selector 1030 receives two coloring schemes 1022 and 1023 as shown in FIG. 10. Since each of the coloring schemes 1022 and 1023 has two color conflicts, the coloring scheme selector 1030 can select either one of them as the coloring scheme for the selected disjoint set. FIG. 10 illustrates that the coloring scheme selector 1030 selects the coloring scheme 1022 as the coloring scheme for the selected disjoint set 841.

The process 1100 then identifies (at 1130) a set of color-seeding nodes that do not conform to the selected coloring scheme as initial search nodes. FIG. 10 illustrates that the initial search node detector 1040 receives a selected coloring scheme 1022 and generates a set of initial search nodes 845 by detecting any color-seeding node having a pre-assigned color that does not conform to the selected coloring scheme. Because the coloring scheme 1022 has two color-seeding shapes 3 and 4 that do not conform to the color assigned to them by the coloring scheme 1022, the shapes 3 and 4 are identified to be the initial search nodes 845 for the disjoint set 841. The initial search nodes 845 act as starting points for performing further searches in order to identify pairs of color-seeding nodes that have color-seeding violations and to identify the error paths that cause the color-seeding violation.

Next, the process 1100 determines (at 1135) whether there are more disjoint sets for processing. When the process 1100 determines that there are more disjoint sets, the process loops back to 1110 to select a new disjoint set to identify initial search nodes. When the process 1100 determines that there is no more disjoint set, the process terminates.

One of ordinary skill in the art will recognize that the process 1100 is a conceptual representation of the operations used to identify initial search nodes. The specific operations of the process 1100 may not be performed in the exact order shown and described. The specific operations may not be performed in one continuous series of operations, and different specific operations may be performed in different embodiments. Furthermore, the process could be implemented using several sub-processes, or as part of a larger macro process. For instance, in some embodiments, the process 1100 is performed by one or more software applications that execute on one or more computers.

Figure 12:
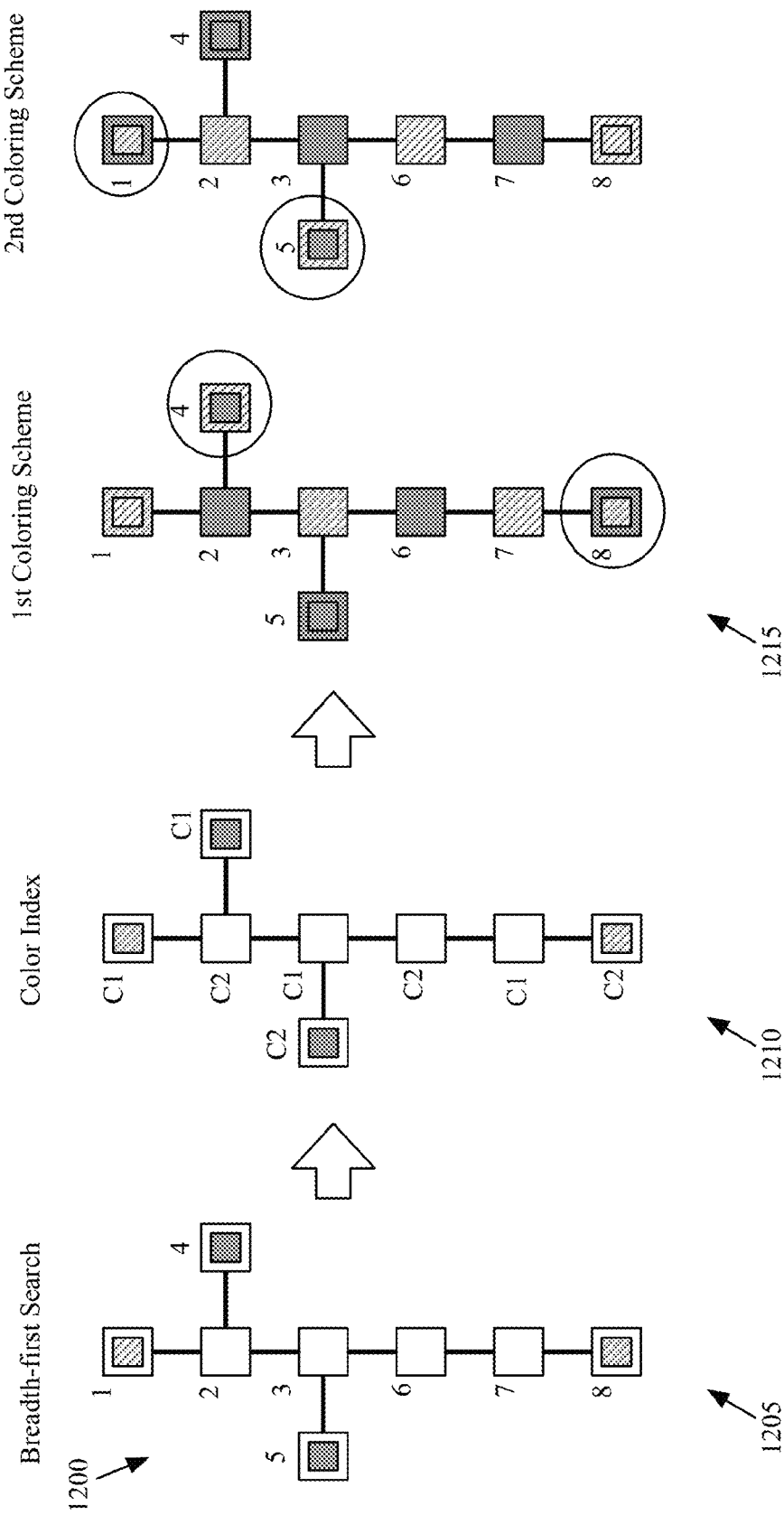
FIG. 12 illustrates an example of identifying a set of initial search nodes for a disjoint set.

FIG. 12 illustrates an example of identifying a set of initial search nodes for a disjoint set. Specifically, this figure illustrates in three operational stages 1205, 1210, and 1215 how to identify initial search nodes for a disjoint set 1200. As shown in FIG. 12, the disjoint set 1200 includes eight shapes 1-8. The shapes 1 and 8 are pre-assigned with a first color (illustrated in the figure as lined gray) and the shapes 4 and 5 are pre-assigned with a second color (illustrated in the figure as solid gray).

As shown in the first stage 1205, an EDA application of some embodiments performs a breadth-first search on the disjoint set 1200. The breadth-first search starts from the shape 1. The search then traverses to the shape 2. Next, the search reaches the shapes 3 and 4. The search then goes to the shapes 5 and 6. Next, the search traverses to the shape 7. The search then ends at the shape 8. In the second stage 1210, a color index, either C1 or C2, is assigned to each node of the disjoint set 1200 based on the breadth-first search. The color index represents the result of the colorization, i.e., the result of assigning shapes in a disjoint set to different masks. If a node at one end of a link is assigned to a first color, the node at another end of the link should be assigned to a second different color, and vice versa. In this example, the shapes 1, 3, 4, and 7 are assigned the color index C1. The shapes 2, 5, 6, and 8 are assigned the color index C2.

In the third stage 1215, nodes in the disjoint set 1200 are applied with two different coloring schemes. For the first coloring scheme, the first color is assigned to each node with color index C1 and the second color is assigned to each node with color index C2. As a result, the shapes 1, 3, 4, and 7 are assigned with the first color and the shapes 2, 5, 6, and 8 are assigned with the second color. Because the shape 4 is pre-assigned with the second color but is assigned with the first color by the first coloring scheme, there is a color conflict for the shape 4 when the first coloring scheme is applied to the disjoint set 1200. Similarly, there is a color conflict for the shape 8 because it is pre-assigned with the first color and is assigned the second color by the first coloring scheme. For the second coloring scheme, the second color is assigned to each node with the color index C1 and the first color is assigned to each node with the color index C2. As a result, the shapes 1, 3, 4, and 7 are assigned with the second color and the shapes 2, 5, 6, and 8 are assigned with the first color. Because shape 1 is pre-assigned with the first color but is assigned with the second color by the second coloring scheme, there is a color conflict for the shape 1 when the second coloring scheme is applied to the disjoint set 1200. Similarly, there is a color conflict for the shape 5 because it is pre-assigned with the second color and is assigned with the first color by the second coloring scheme.

In some embodiments, the coloring scheme with less number of color conflicts is selected as the coloring scheme for the disjoint set. Since each of the first and second coloring schemes has two color conflicts, the two coloring schemes have the same number of color conflicts and either one of them can be selected as the coloring scheme for the disjoint set 1200. If the first coloring scheme is selected, the shapes 4 and 8 will be identified as the initial search nodes. However, if the second coloring scheme is selected, the shapes 1 and 5 will be identified as the initial search nodes.

III. Identification of Color-Seeding Violations

Figure 13:
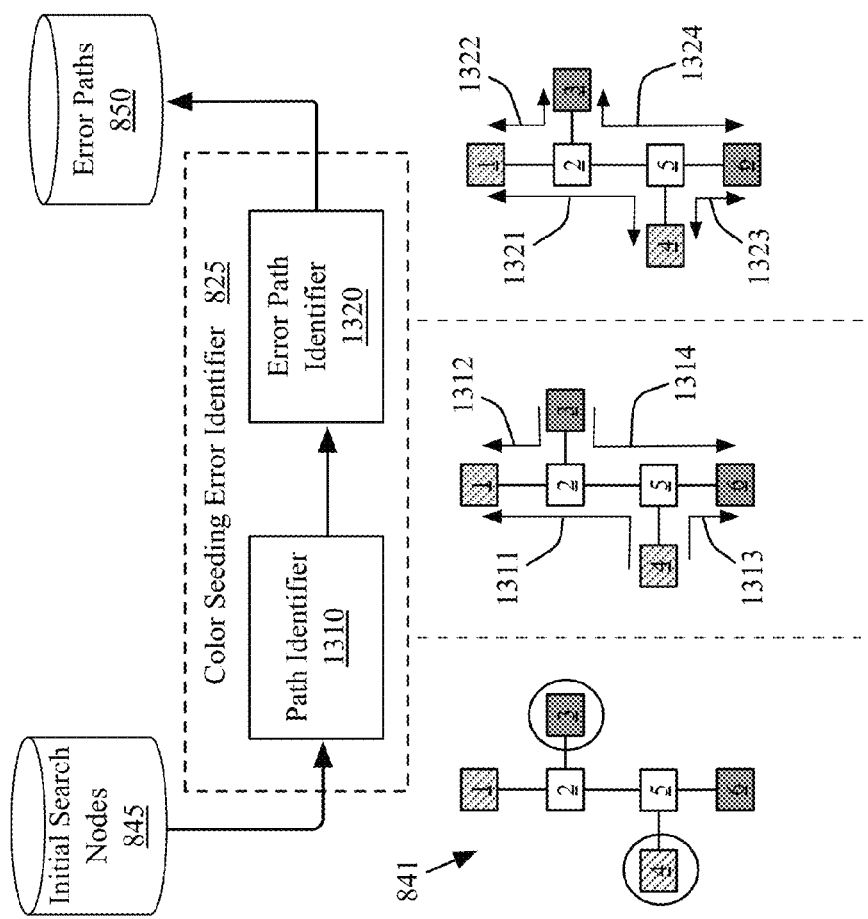
FIG. 13 conceptually illustrates a color-seeding error identifier of some embodiments.

FIG. 13 conceptually illustrates a color seeding error identifier 825 of some embodiments. Specifically, the figure illustrates an example of identifying a set of error paths that causes color-seeding violations between pairs of color-seeding nodes. The color seeding error identifier 825 receives a disjoint set that has a set of initial search nodes 845 and identifies a set of error paths 850 based on the set of initial search nodes 845.

This figure illustrates the set of initial search nodes 845, the color seeding error identifier 825, and the set of error paths 850. The color seeding error identifier 825 includes a path identifier 1310 and an error path identifier 1320. In some embodiments, the color seeding error identifier 825 receives the set of initial search nodes 845 for each disjoint set in a design layout and identifies a set of error paths 850 that causes color-seeding violations between pairs of color-seeding nodes in the disjoint set of shapes. For instance, the disjoint set 841 includes six shapes 1-6. The shapes 1 and 4 are pre-assigned with a first color (illustrated in the figure as lined gray) and the shapes 3 and 6 are pre-assigned with a second color (illustrated in the figure as solid gray). This means the designer has pre-assigned the shapes 1 and 4 to a first mask and the shapes 3 and 6 to a second different mask.

The path identifier 1310 receives a disjoint set 841 with two initial search nodes 3 and 4. The path identifier 1310 then traverses the disjoint set 841 based on each of the initial search node. In some embodiments, the path identifier 1310 traverses the disjoint set 841 by using the breadth-first search, starting from each initial search node. When a breadth-first search reaches a color-seeding node, the search stops along that branch. For example, the path identifier 1310 starts a breadth-first search from a first initial search node, the shape 4. It first reaches the shape 5, then shapes 6 and 2. Because the shape 6 is a color-seeding node, the search stops along that branch and a path 1313 is identified between the shapes 4 and 6. The search goes on to reach the shapes 1 and 3, both of which are color-seeding nodes. Therefore, a path 1311 is identified between the shapes 4 and 1. The path identifier 1310 does not identify any path between two initial search nodes because there is no coloring-seeding violation between two initial search nodes. Therefore, no path is identified between the shapes 4 and 3 because both of them are initial search nodes. Since all nodes in the disjoint set 841 has been reached, the breadth-first search originated from the shape 4 stops.

The path identifier 1310 then starts another breadth-first search from another initial search node, the shape 3. It first reaches the shape 2. Next, the breadth-first search goes to the shapes 1 and 5. Because the shape 1 is a color-seeding node, the search stops along that branch and a path 1312 is identified between the shapes 3 and 1. The search goes on to reach the shapes 4 and 6, both of which are color-seeding nodes. A path 1314 is identified between the shapes 3 and 6. No path is identified between the shapes 3 and 4 because both of them are initial search nodes. Since all nodes in the disjoint set 841 has been reached, the breadth-first search originated from the shape 3 stops. In this example, the path identifier 1310 conducts breadth-first searches from the initial search nodes 3 and 4 and identifies four paths 1311-1314.

The error path identifier 1320 receives a set of paths identified by the path identifier 1310 and identifies error node pairs and error paths based on the received paths. If the nodes at each end of a path, i.e., the source node and the destination node, have the same pre-assigned color and there is an odd number of links in the path, the source node and the destination node form an error node pair. If the source node and destination node of a path are pre-assigned with different colors but there is an even number of links in the path, the source node and the destination node form an error node pair. For instance, the error path identifier 1320 receives four paths 1311-1314. Because the source node 4 and the destination node 1 of the path 1311 are pre-assigned with the same first color and there are three (i.e., an odd number) links in the path, the error path identifier 1320 identifies the nodes 4 and 1 as forming an error node pair. In addition, the error path identifier 1320 identifies the path 1311 as an error path 1321. Because the source node 3 and destination node 1 of the path 1312 are pre-assigned with different colors and there are two (i.e. an even number) links in the path, the error node pair identifier 1320 identifies the nodes 3 and 1 as forming an error node pair. In addition, the error path identifier 1320 identifies the path 1312 as an error path 1322. Similarly, the error path identifier 1320 identifies the nodes 4 and 6 as forming an error node pair and the path 1313 as an error path 1323. The error path identifier 1320 also identifies the nodes 3 and 6 as forming an error node pair and the path 1314 as an error path 1324. The identified error paths 850 will be received by the marker generator 830 described above by reference to FIG. 8 in order to be displayed to visually assist the users.

A. Identification of a Single Error Path for Each Error Node Pair

Figure 14:
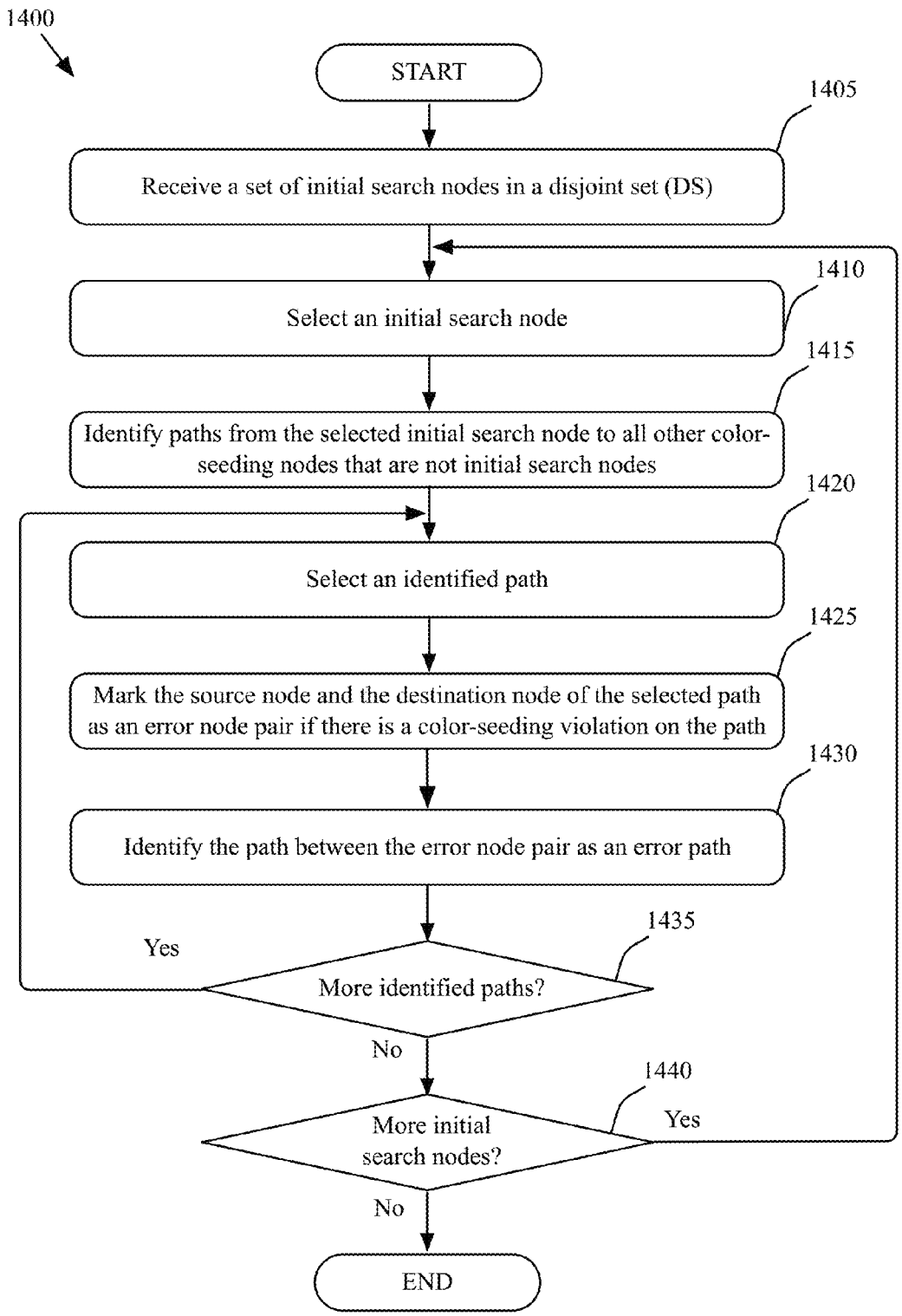
FIG. 14 conceptually illustrates a process performed by some embodiments for each disjoint set to identify color-seeding violations based on a set of initial search nodes.

An example operation of the color seeding error identifier 825 will now be described by reference to FIG. 14. FIG. 14 conceptually illustrates a process 1400 performed by some embodiments for each disjoint set to identify color-seeding violations based on a set of initial search nodes. In some embodiments, the DP color-seeding marker generator 800 performs the process 1400. The process 1400 begins by receiving (at 1405) a set of initial search nodes in a disjoint set. As the example described above, FIG. 13 illustrates two example initial search nodes 3 and 4 in the disjoint set 841 that the color seeding error identifier 825 has received.

Next, the process 1400 selects (at 1410) an initial search node as a starting point to traverse the disjoint set. For example, the process 1400 selects the initial search node 3 as the starting point, as illustrated in FIG. 13. The process 1400 then identifies (at 1415) paths from the selected initial search node to all other color-seeding nodes that are not initial search nodes. The reason that the process 1400 does not identify paths to any other initial search nodes is because there is no coloring-seeding violation between two initial search nodes. FIG. 13 illustrates an example in which the path identifier 1310 traverses the disjoint set 841 by using the breadth-first search, starting from the initial search node 3. After the search is completed, the path identifier 1310 identifies two paths 1312 and 1314.

The process 1400 then selects (at 1420) an identified path for further processing. Next, the process 1400 marks (at 1425) the source node and the destination node of the selected path as an error node pair when there is a color-seeding violation on the path. The process 1400 then identifies (at 1430) the path between the error node pair as an error path. As illustrated in the example in FIG. 13, the error node pair identifier 1320 selects the path 1312. The error node pair identifier 1320 identifies the nodes 3 and 1 as forming an error node pair 1322 because the source node 3 and destination node 1 of the path 1312 are pre-assigned with different colors and there are two links in the path. The error path identifier 1330 then identifies an error path 1332 based on the identified error node pair 1322 and the path 1312 between them.

Next, the process 1400 determines (at 1435) whether there are more identified paths need to be processed. When there are more identified paths, the process 1400 loops back to 1420 to select another identified path. When it is determined at 1435 that there are no more identified path, the process 1400 determines (at 1440) whether there are more initial search nodes need to be processed. When there are more initial search nodes, the process 1400 loops back to 1410 to select another initial search. When it is determined at 1440 that there is no more initial search node, the process 1400 ends.

One of ordinary skill in the art will recognize that process 1400 is a conceptual representation of the operations used to identify color-seeding violations in a disjoint set. The specific operations of process 1400 need not be performed in the exact order shown and described. The specific operations need not be performed in one continuous series of operations, and different specific operations may be performed in different embodiments. Furthermore, the process could be implemented using several sub-processes, or as part of a larger macro process.

Figure 15:
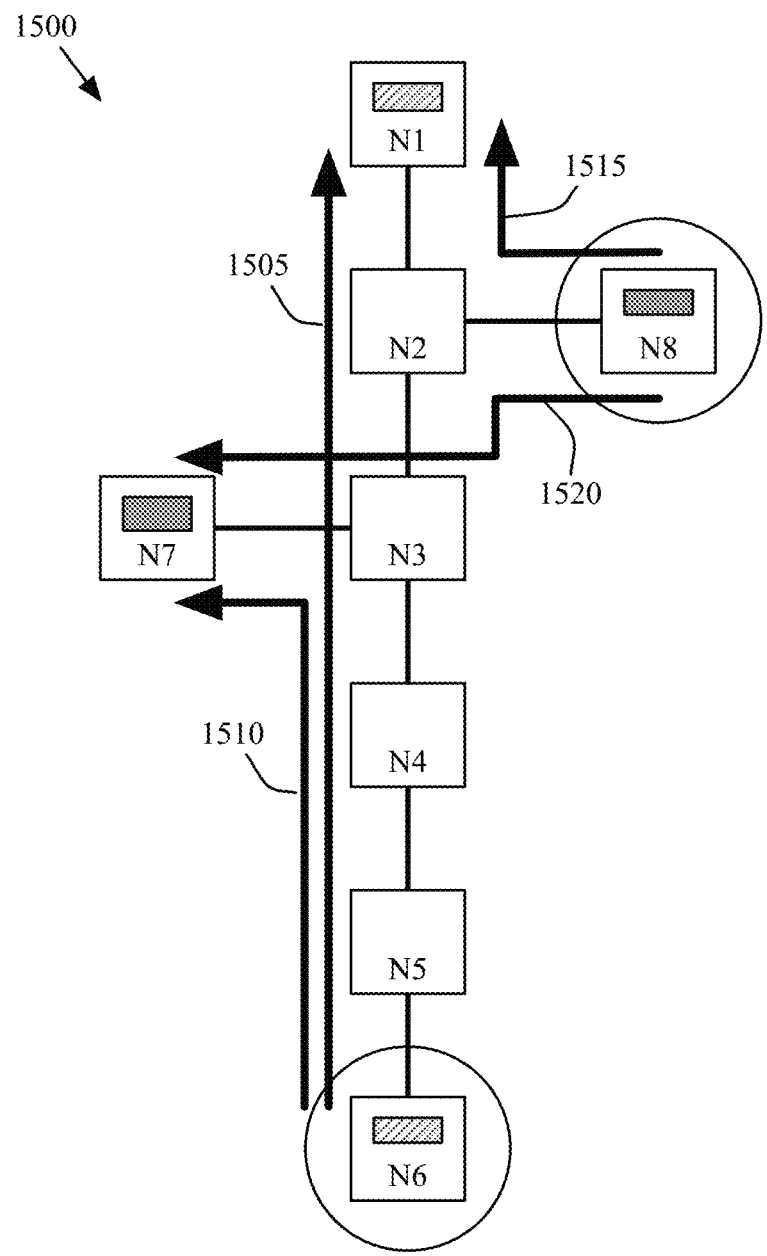
FIG. 15 illustrates an example of identifying color-seeding violations in a disjoint set.

FIG. 15 illustrates an example of identifying color-seeding violations in a disjoint set. Specifically, this figure illustrates how to identify error node pairs and error paths within a disjoint set 1500. As shown in FIG. 15, the disjoint set 1500 includes eight shapes N1-N8, among which N6 and N8 have been identified as initial search nodes and circled accordingly. The shapes N1 and N6 are pre-assigned with a first color (illustrated in the figure as lined gray) and the shapes N7 and N8 are pre-assigned with a second color (illustrated in the figure as solid gray). This means the designer has pre-assigned the shapes N1 and N6 to a first mask and the shapes N7 and N8 to a second different mask.

A first breadth-first search is initiated from the initial search node N6. The search first traverses to the shape N5, then to the shape N4. The first breadth-first search continues to reach the shape N3. Next, the search traverses to the shapes N7 and N2. Because the shape N7 is a color-seeding node, the search stops along that branch and a path 1510 is identified between the shapes N6 and N7. The search goes on to reach the shapes N1 and N8, both of which are color-seeding nodes. Therefore, a path 1505 is identified between the shapes N6 and N1. No path is identified between the shapes N6 and N8 because both of them are initial search nodes. Since all nodes in the disjoint set 1500 have been reached, the first breadth-first search ends.

A second breadth-first search is then started from the initial search node N8. The search first traverses to the shape N2. Next, the second breadth-first search goes to the shapes N3 and N1. Because the shape N1 is a color-seeding node, the search stops along that branch and a path 1515 is identified between the shapes N8 and N1. The search goes on to reach the shapes N4 and N7. Because the shape N7 is a color-seeding node, the search stops along that branch and a path 1520 is identified between the shapes N8 and N7. Next, the search traverses to the shape N5, and then to the shape N6, which is a color-seeding node. No path is identified between the shapes N8 and N6 because both of them are initial search nodes. Since all seeded nodes in the disjoint set 1500 has been reached, the second breadth-first search ends. In this example, two breadth-first searches are conducted from the initial search nodes N6 and N8 and four paths 1505-1515 are identified.

For the path 1505, because the source node N6 and the destination node N1 are pre-assigned with the same first color and there are five (i.e., an odd number) links in the path between them, the nodes N1 and N6 are identified as an error node pair and the path 1505 is identified as an error path. For the path 1510, because the source node N6 and the destination node N7 are pre-assigned with different colors and there are four (i.e., an even number) links in the path between them, the nodes N7 and N6 are identified as an error node pair and the path 1510 is identified as an error path. Similarly, the nodes N8 and N1 are identified as an error node pair and the path 1515 is identified as an error path. The nodes N8 and N7 are identified as an error node pair and the path 1520 is identified as an error path. The identified error paths 1505-1520 will then be marked and displayed to assist users in resolving the color-seeding violations in the disjoint set 1500.

B. Identification of Multiple Error Paths for an Error Node Pair

In some of the embodiments described above, the color seeding error identifier identifies a single error path for each error node pair. However, in complex circuit design layout, multiple error paths could exist between an error node pair. An example operation of identifying multiple error paths for an error node pair will be described below by reference to FIG. 17. However, before getting into the details of the operation, the concept of "hole" needs to be introduced first.

Figure 16:
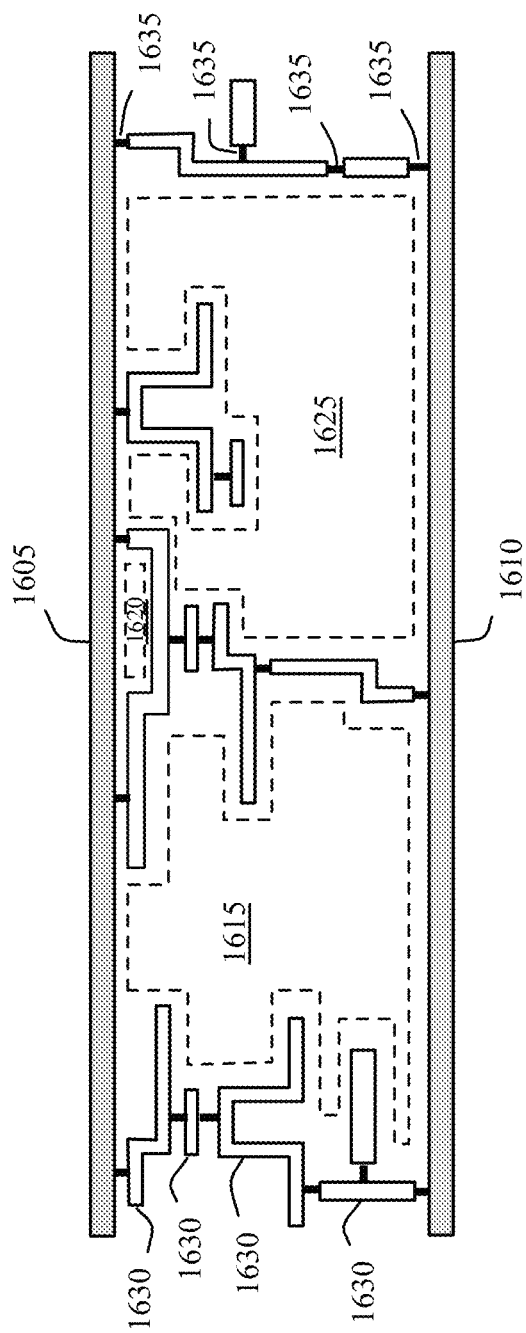
FIG. 16 conceptually illustrated a circuit design layout segment containing a union of all nodes and links that are connected to an error node pair.

FIG. 16 conceptually illustrated a circuit design layout segment containing a union of all nodes and links that are connected to an error node pair. As shown, the figure illustrates a source node 1605, a destination node 1610, several uncolored nodes 1630, and several links 1635 between nodes. The source node 1605 and the destination node 1610 are pre-assigned with the same color and form an error node pair. The uncolored nodes 1630 and links 1635 illustrated in the figure is a union of all nodes and links that are connected to the error node pair of 1605 and 1610.

A hole is a space enclosed by a loop formed by nodes and links. As shown in FIG. 16, there are three holes 1615, 1620, and 1625 illustrated in dotted lines in the figure. Among them, holes 1615 and 1625 touch both the source node 1605 and the destination node 1610. Hole 1620 touches the source node 1605, but does not touch the destination node 1610.

Figure 17:
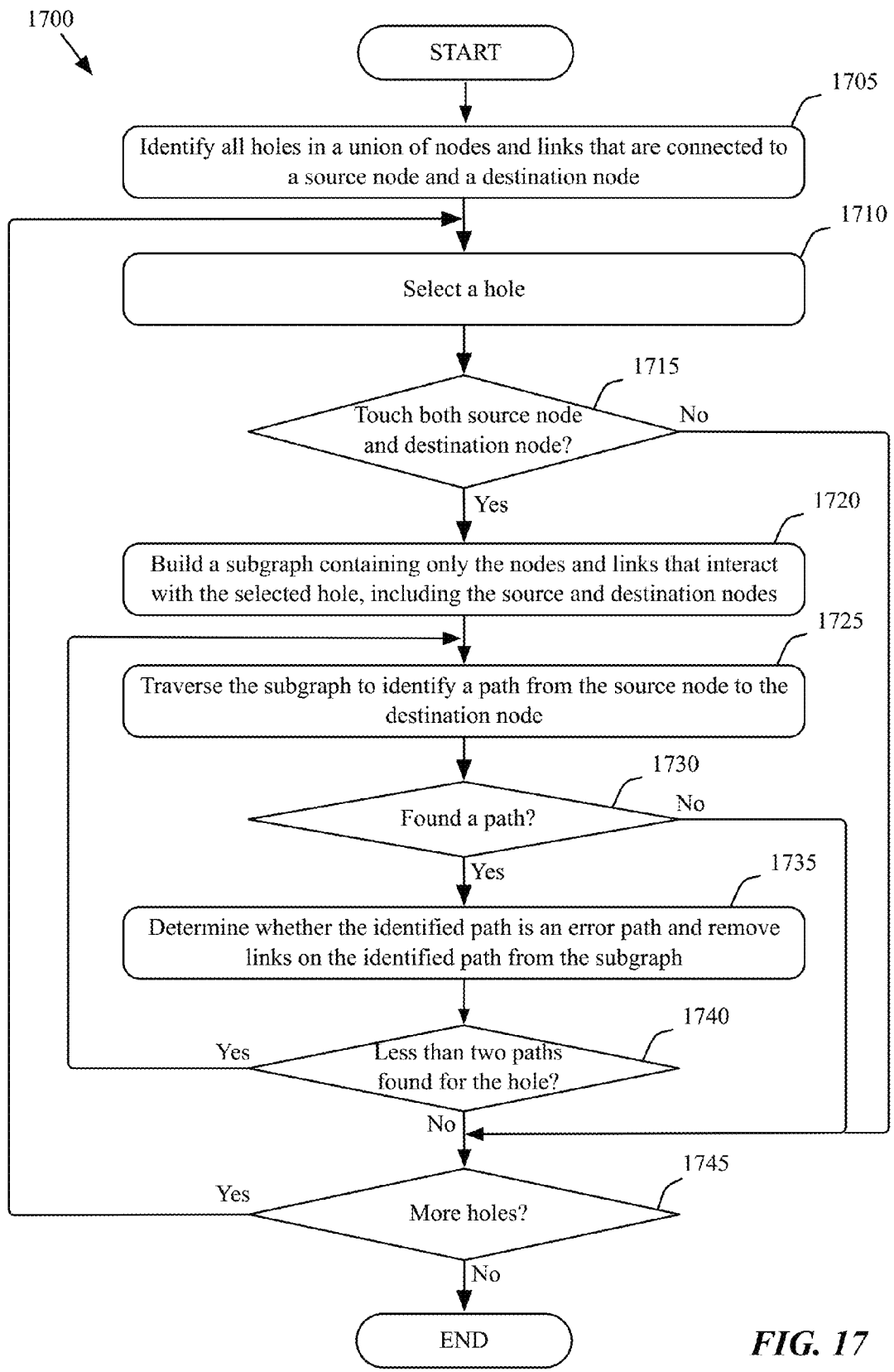
FIG. 17 conceptually illustrated a process performed by some embodiments to identify multiple error paths between an error node pair.

An example operation of identifying multiple error paths for an error node pair will now be described by reference to FIG. 17. FIG. 17 conceptually illustrated a process 1700 performed by some embodiments to identify multiple error paths between an error node pair. In some embodiments, the DP color-seeding marker generator 800 performs the process 1700. In some embodiments, the process 1700 launches after the process 1400 (described above by reference to FIG. 14) has identified an error path between the error node pair. The process 1700 begins by identifying (at 1705) all holes in a circuit design layout segment. The circuit design layout segment includes a union of nodes and links that are connected to a source node and a destination node of the error node pair.

Next, the process 1700 selects (at 1710) an identified hole for processing. The process 1700 determines (at 1715) whether the selected hole touches both the source node and the destination node of the error node pair. When the process 1700 determines (at 1715) that the selected hole does not touch both the source node and the destination node, the process proceeds to 1745. When the process 1700 determines (at 1715) that the selected hole touches both the source node and the destination node, the process builds (at 1720) a sub-graph containing only the nodes and links that form the selected hole. The sub-graph also includes the source node and the destination node of the error node pair. Next, the process 1700 traverses (at 1725) the sub-graph to identify a path from the source node to the destination node. In some embodiments, the process 1700 uses the breadth-first search to traverse the sub-graph. The process 1700 of some embodiments uses other traversal methods, e.g., the depth-first search, to traverses the sub-graph.

The process 1700 then determines (at 1730) whether a path from the source node to the destination node has been found through the traversal. When the process 1700 determines (at 1730) that no path was found from the source node to the destination node through the traversal, the process proceeds to 1745. When the process 1700 determines (at 1730) that a path from the source node to the destination node has been found through the traversal, the process determines (at 1735) whether the identified path is an error path and removes links on the identified path from the sub-graph. In some embodiments, in addition to removing links, the process 1700 also removes nodes on the identified path (other than the source node and the destination node) from the sub-graph. If the source node and the destination node have the same pre-assigned color and there is an odd number of links in the identified path, the identified path is marked as an error path. If the source node and destination node are pre-assigned with different colors but there is an even number of links in the identified path, the identified path is marked as an error path. Once a path is identified, regardless whether it is an error path or not, the links on the path is removed to prevent the same path from being traversed again by the process 1700.

Next, the process 1700 determines (at 1740) whether the number of paths identified for the selected hole is less than two. When the process 1700 determines (at 1740) that the number of paths identified for the selected hole is less than two, the process loops back to 1725 to traverse the sub-graph again to identify another path between the source node and the destination node. When the process 1700 determines (at 1740) that the number of paths identified for the selected hole is not less than two, the process proceeds to 1745. It is usually sufficient to traverse the sub-graph twice to find all the paths associated with a given hole. The process 1700 does not traverse the sub-graph to find another error path once two paths are found.

At 1745, the process 1700 determines whether there are more holes need to be processed. When the process 1700 determines (at 1745) that there are more holes need to be processed, the process loops back to 1710 to select another hole. When the process 1700 determines (at 1745) that there are no more holes to be processed, the process terminates.

One of ordinary skill in the art will recognize that process 1700 is a conceptual representation of the operations used to identify multiple error paths between an error node pair. The specific operations of process 1700 need not be performed in the exact order shown and described. The specific operations need not be performed in one continuous series of operations, and different specific operations may be performed in different embodiments. Furthermore, the process could be implemented using several sub-processes, or as part of a larger macro process. For example, the processing of each hole can be performed in parallel instead of serially as illustrated in the figure.

Figure 18:
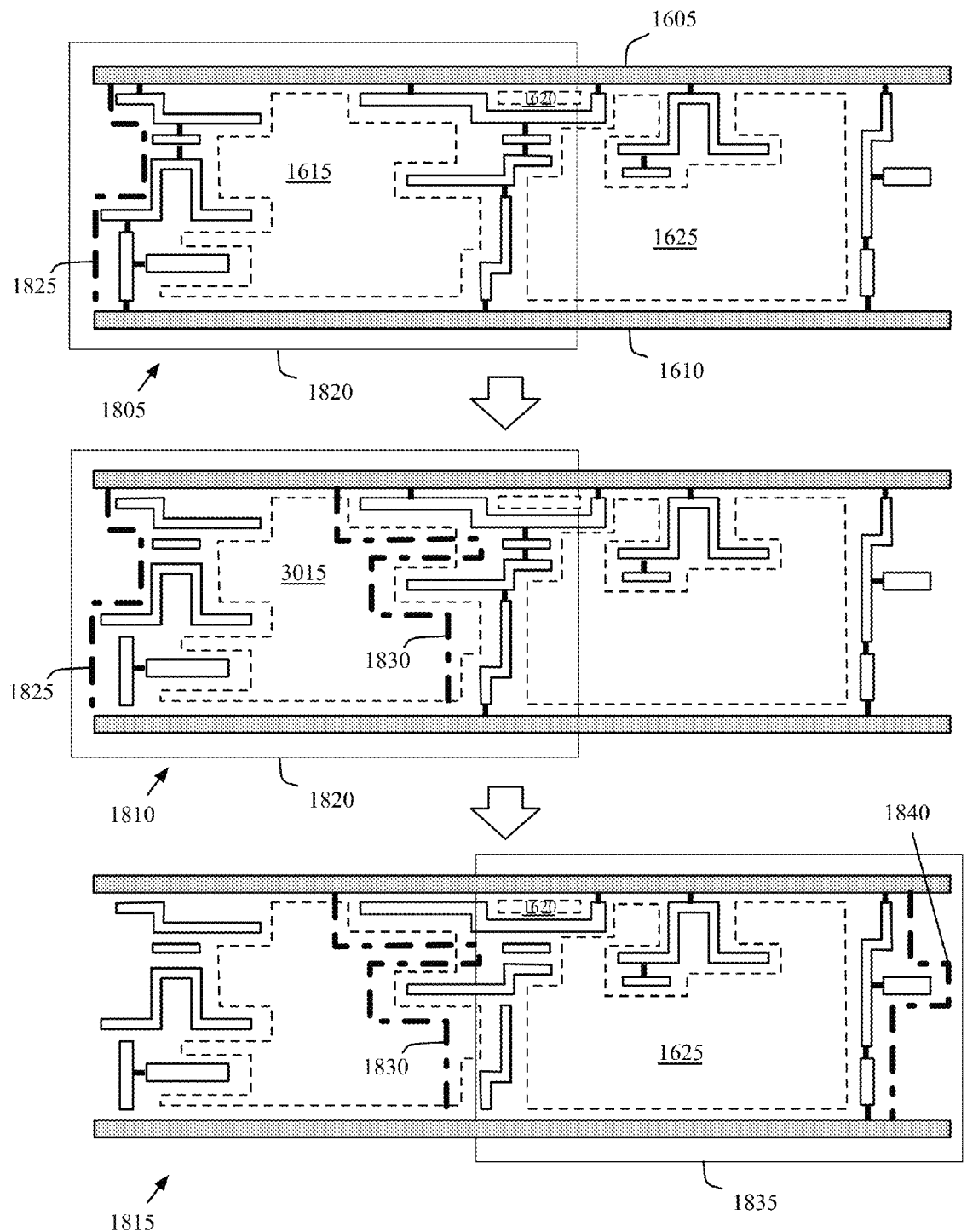
FIG. 18 illustrates an example of identifying multiple error paths for an error node pair.

FIG. 18 illustrates an example of identifying multiple error paths for an error node pair. Specifically, this figure illustrates how to identify multiple error paths between the source node 1605 and the destination node 1610 described above by reference to FIG. 16. As shown in FIG. 18, the figure illustrates in three stages 1805, 1810, and 1815 that the error node pair is being checked to identify multiple error paths between the source node 1605 and the destination node 1610 of the error node pair. The figure illustrates the source node 1605, the destination node 1610, several uncolored nodes, and several links between nodes. The source node 1605 and the destination node 1610 are pre-assigned with the same color and form the error node pair. The uncolored nodes and the links illustrated in the figure is a union of all nodes and links that are connected to the error node pair of 1605 and 1610. There are three holes 1615, 1620, and 1625 identified for the union of nodes and links.

In the first stage 1805, the hole 1615 is selected for processing. Because the hole 1615 touches both the source node 1605 and the destination node 1610, a sub-graph 1820 is built to include only the nodes and links that form the hole 1615, as well as the source node 1605 and the destination node 1610. A traversal method, e.g., the breadth-first search, is then used to traverse the sub-graph 1820 to search for a path from the source node 1605 to the destination node 1610. As illustrated in the first stage 1805, a path 1825 between the source and destination nodes is identified as a result of the traversal. Because the source node 1605 and the destination node 1610 are pre-assigned with the same color and there are five (i.e., odd number of) links on the path 1825, there is a color-seeding violation on the path. Therefore, the path 1825 is an error path.

In the second stage 1810, the five links on the path 1825 are removed to prevent the same path being traversed again. A new search is performed on the sub-graph 1830 to identify another path from the source node 1605 to the destination node 1610 along the hole 1615. This time, a new path 1830 is identified. Because the source node 1605 and the destination node 1610 are pre-assigned with the same color and there are five (i.e., odd number of) links on the path 1830, there is a color-seeding violation on the path. Therefore, the path 1830 is an error path. Since two traversals have been performed on the sub-graph 1820 along the hole 1615, the hole 1615 is considered processed and a third traversal will not be performed on the sub-graph 1820.

In the third stage 1815, the five links on the path 1830 are removed to prevent the same path being traversed again. The hole 1620 is selected for processing. However, the hole 1620 only touches the source node 1605 and does not touches the destination node 1610. As a result, the hole 1620 will not be processed further because there is no path from the source node 1605 to the destination node 1610 along this particular hole.

Next, the hole 1625 is selected for processing. Because the hole 1625 touches both the source node 1605 and the destination node 1610, a sub-graph 1835 is built to include only the nodes and links that form the hole 1625, as well as the source node 1605 and the destination node 1610. A traversal method is then used to traverse the sub-graph 1835 to search for a path from the source node 1605 to the destination node 1610. As illustrated in the third stage 1815, a path 1840 between the source and destination nodes is identified as a result of the traversal. Because the source node 1605 and the destination node 1610 are pre-assigned with the same color and there are three (i.e., odd number of) links on the path 1840, there is a color-seeding violation on the path. Therefore, the path 1840 is an error path.

A new traversal is then performed on the sub-graph 1835 and no new path is found between the source node 1605 and the destination node 1610. Consequently, the hole 1625 is considered processed. In the end, all the identified holes 1615, 1620, and 1625 for the union of nodes and links that are connected to the error node pair of 1605 and 1610 have been processed and three error paths 1825, 1830, and 1840 have been identified for the error node pair.

IV. Display of Error Paths

Figure 19:
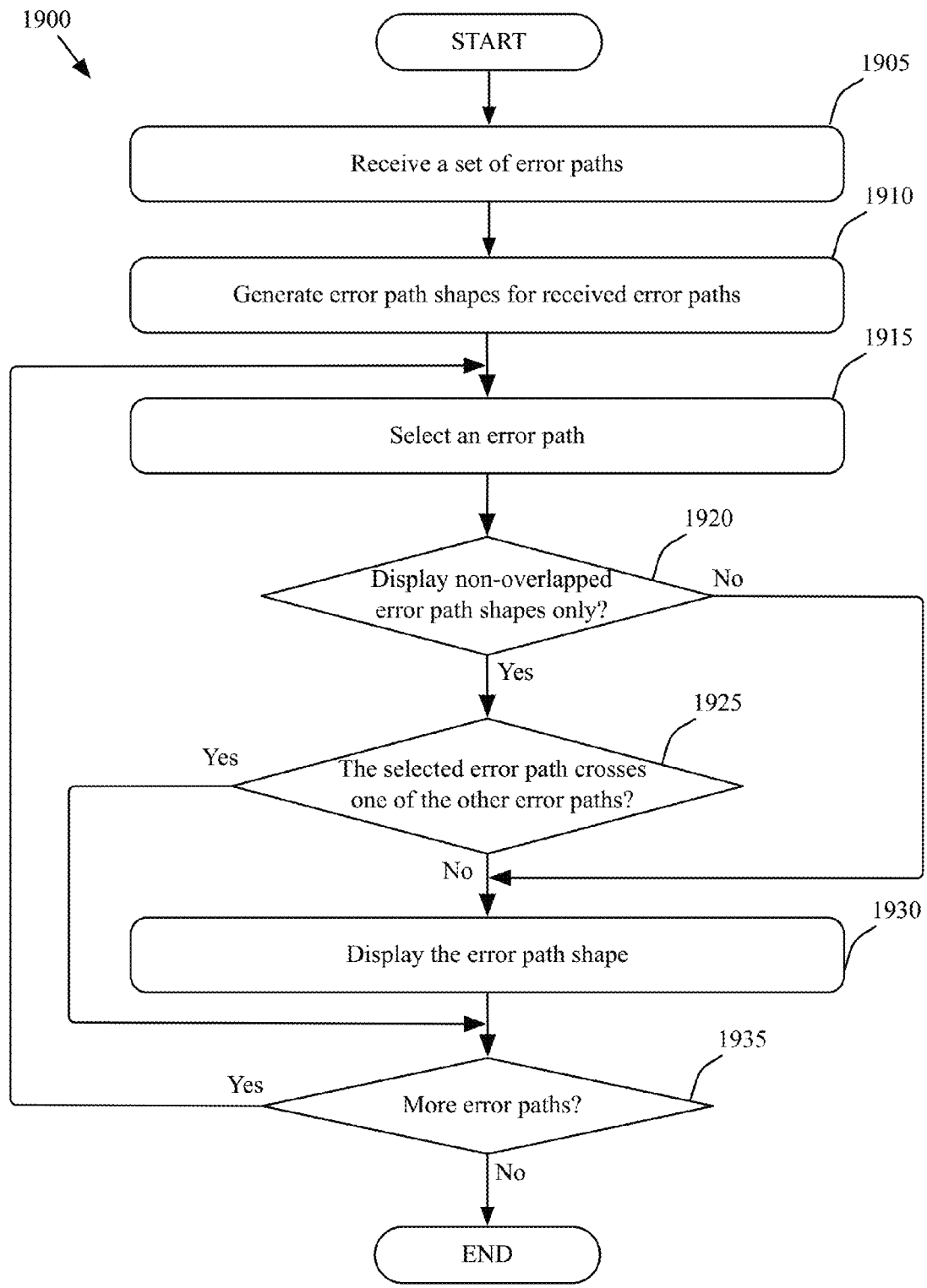
FIG. 19 conceptually illustrates a process that some embodiments perform to mark and display error paths.

In order to aid the users in resolving the color-seeding violations, an EDA application of some embodiments marks the identified error paths and displays them to the users. FIG. 19 conceptually illustrates a process 1900 that some embodiments perform to mark and display error paths in order to visually assist the users of design solutions to recognize the color-seeding violations. The process 1900 is performed when a user executes the software application or runs the system in order to modify a design layout that contains color-seeding violations.

As shown, the process 1900 retrieves or receives (at 1905) a set of error paths, each of which indicates a color-seeding violation caused by a color-seeding node pair in the design layout. Next, the process 1900 generates (at 1910) error path shapes for received error paths. An error path shape is a geometric shape that visually identifies a path between two color-seeding nodes that contains a color-seeding violation. These error path shapes are called color-seeding markers in some embodiments. The process 1900 in some embodiments stores the generated error path shapes in a repository such as the color-seeding markers repository 810 described above by reference to FIG. 8.

Next, the process 1900 selects (at 1915) an error path from the set of error paths received at 1905. The process 1900 then determines (at 1920) whether to display non-overlapped error path shapes only. An overlapped error path is an error path that crosses another error path. In some embodiments, the process 1900 only displays non-overlapped error path shapes to the users to visually assist them resolving color-seeding violations.

When the process 1900 determines (at 1920) that it will display all error path shapes, the process displays (at 1930) the error path shape for the selected error path. When the process 1900 determines (at 1920) that it will only display non-overlapped error path shape, the process determines (at 1925) whether the selected error path crosses one of the other error paths. This is to determine whether the selected error path is an overlapped error path or not. When the process 1900 determines (at 1925) that the selected error path crosses one of the other error paths, the process 1900 jumps forward to 1935. When the process 1900 determines (at 1925) that the selected error path does not cross one of the other error paths, i.e., the selected error path is a non-overlapped error path, the process continues to 1930 to display the error path shape for the selected error path.

Next, the process 1900 determines (at 1935) whether there are more error paths available for processing. When the process 1900 determines (at 1935) that there are more error paths, the process loops back to 1915 to select another error path. When the process 1900 determines (at 1935) that there is no more error path for processing, the process terminates.

One of ordinary skill in the art will recognize that the process 1900 is a conceptual representation of the operations used to display error path shapes. The specific operations of process 1900 need not be performed in the exact order shown and described. The specific operations need not be performed in one continuous series of operations, and different specific operations may be performed in different embodiments. Furthermore, the process could be implemented using several sub-processes, or as part of a larger macro process.

In some embodiments, the EDA application displays the color-seeding violations in a number of different ways. For example, the user can browse through each error path. The EDA application can also switch between displaying all error paths and displaying only non-overlapped error paths. A couple of examples for displaying color-seeding violations will be described below.

Figure 20:
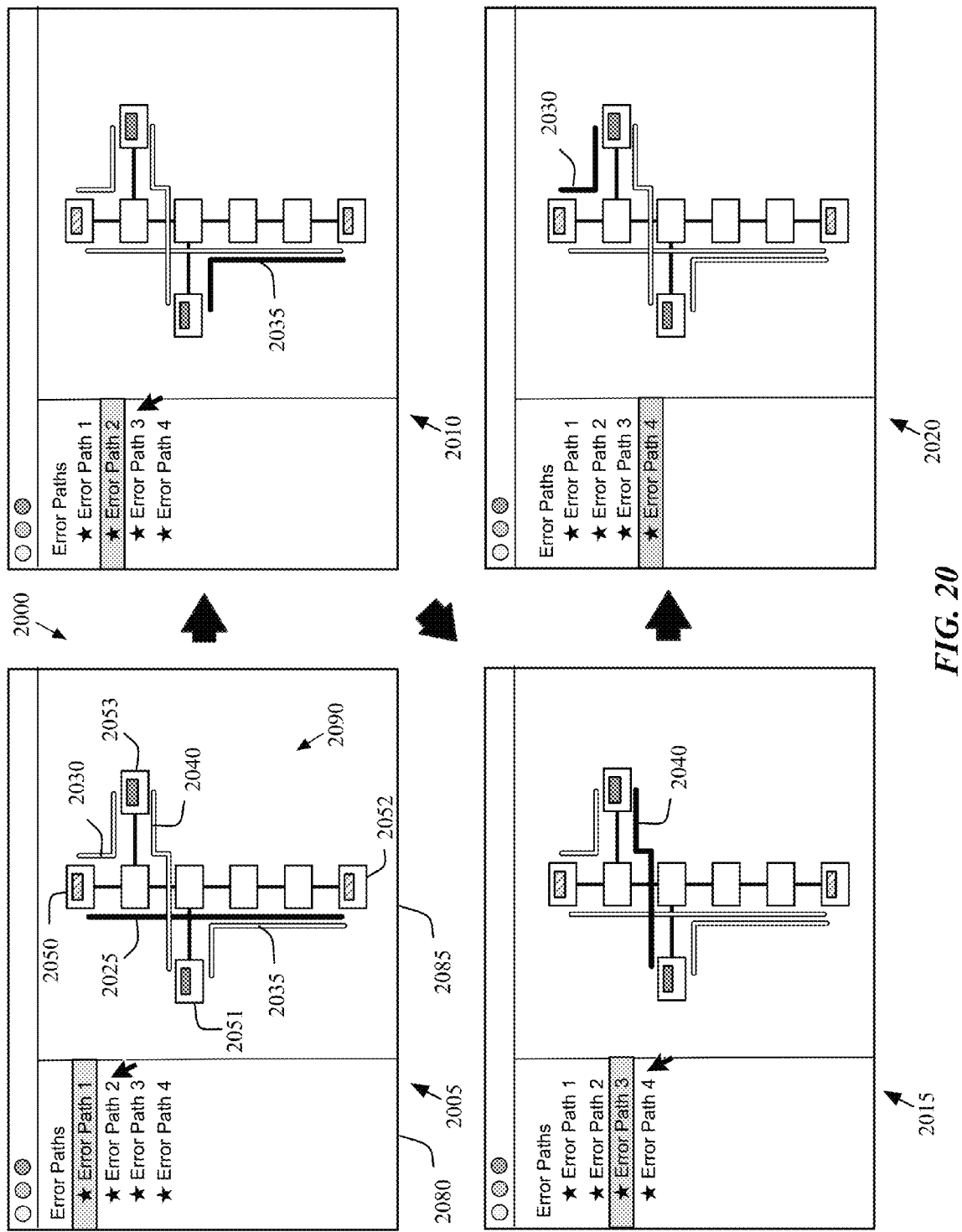
FIG. 20 illustrates a graphical user interface ("GUI") of an EDA application that displays color-seeding violations.

For some embodiments, FIG. 20 illustrates a graphical user interface ("GUI") 2000 of an EDA application that displays color-seeding violations. Specifically, this figure illustrates in four operational stages 2005-2020 how the GUI 2000 can be used to easily browse through each identified error path. As shown in FIG. 20, the GUI 2000 includes an error path list pane 2080 and an error path shape display area 2085.

The error path list pane 2080 lists all the error paths that can be displayed in the GUI 2000. In this example, there are four list items, Error Path 1-4, listed in the error path list pane 2080. When the EDA application receives a selection of a list item listed in the error path list pane 2080, the EDA application highlights the corresponding error path shape in the error path shape display area 2085.

The error path shape display area 2085 displays a graph representation of a design layout. In this example, a disjoint set 2090 is displayed in the error path shape display area 2085. The disjoint set 2090 includes eight shapes. There is a link between two shapes if they are pitch constrained. The shapes 2050 and 2052 are pre-assigned with a first color (illustrated in the figure as lined gray) and the shapes 2051 and 2053 are pre-assigned with a second color (illustrated in the figure as solid gray). This means the designer has pre-assigned the shapes 2050 and 2052 to a first mask and the shapes 2051 and 2053 to a second different mask. There are four error path shapes 2025-2040 displayed in the error path shape display area 2085. The error path shape 2025 indicates a color-seeding violation and the error path between the nodes 2050 and 2052. The error path shape 2030 indicates a color-seeding violation and the error path between the nodes 2050 and 2053. The error path shape 2035 indicates a color-seeding violation and the error path between the nodes 2051 and 2052. The error path shape 2040 indicates a color-seeding violation and the error path between the nodes 2051 and 2053. The EDA application will highlight an error path shape when it receives a selection of the corresponding list item in the error path list pane 2080.

Having described the elements of the GUI 2000, the operations of browsing displayed error paths will now be described by reference to the state of the GUI during the four stages 2005-2020 that are illustrated in FIG. 20. In the first stage 2005, the Error Path 1 is selected in the error path list pane 2080. As shown in the first stage 2005, the error path 2025 is highlighted in the error path shape display area 2085 because it corresponds to the selected Error Path 1. A highlighted error path shape helps the user visually identify the error path of interest in order to resolve the corresponding color-seeding violation. The user can highlight another error path shape in the error path shape display area 2085 by selecting a different list item in the error path list pane 2080.

In the second stage 2010, the user selects the list item Error Path 2 in the error path list pane 2080. As a result, the error path shape 2035 is highlighted in the error path shape display area 2085. The third stage 2015 illustrates the list item Error Path 3 is selected in the error path list pane 2080 and its corresponding error path shape 2040 is highlighted in the error path shape display area 2085. In the fourth stage 2020, the user selects the list item Error Path 4 in the error path list pane 2080. As a result, the error path shape 2030 is highlighted in the error path shape display area 2085.

One of ordinary skill in the art will recognize that the GUI 2000 is a conceptual representation of the operations used to display color-seeding violations. The specific operations and/or elements of the GUI need not in the exact form as shown and described. For example, the GUI 2000 may include more element and controls to perform the operations. The GUI 2000 may use a tab control to display list all the error paths and to display each of them in separate tabs.

Figure 21:
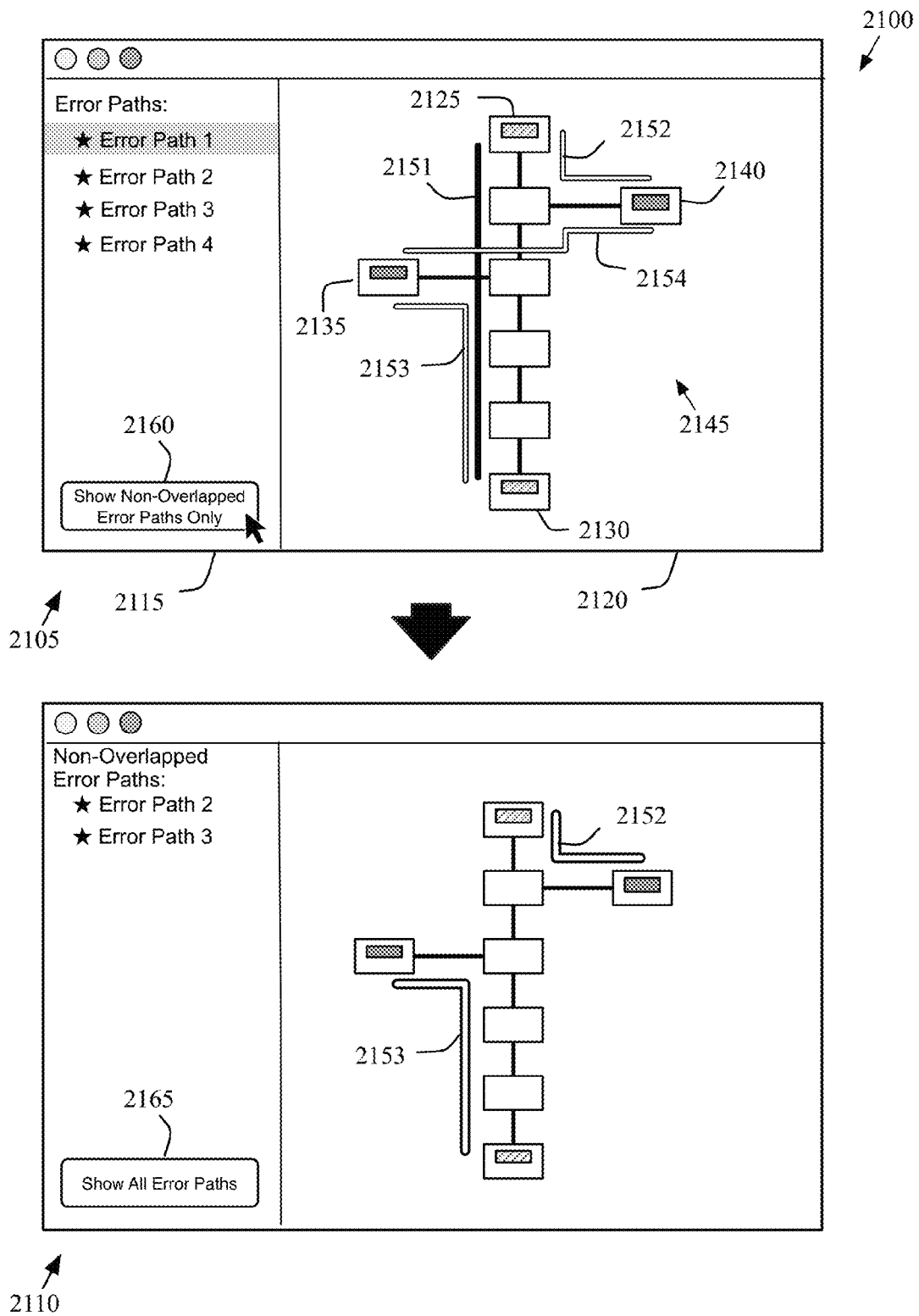
FIG. 21 illustrates a GUI of an EDA application that switches between displaying all error paths and displaying non-overlapped error paths only.

FIG. 21 illustrates a graphical user interface ("GUI") 2100 of an EDA application that switches between displaying all error paths and displaying non-overlapped error paths only. Specifically, this figure illustrates in two operational stages 2105 and 2110 how the GUI 2100 can be used to easily switching between the two configuration of displaying error paths. As shown in FIG. 21, the GUI 2100 includes an error path list pane 2115 and an error path shape display area 2120.

The error path list pane 2115 lists all the error paths that can be displayed in the GUI 2100. As illustrated in the first stage 2105, there are four list items, Error Path 1-4, listed in the error path list pane 2115. A user can selected a list item listed in the error path list pane 2115 to have the corresponding error path shape highlighted in the error path shape display area 2120. For example, when the user selects the list item Error Path 1 in the error path list pane 2115, the corresponding error path shape 2151 is highlighted in the error path shape display area 2120. The error path list pane 2115 also includes a button 2160 that will switch the GUI 2100 to show non-overlapped error paths only when clicked.

The error path shape display area 2120 display a graph representation of a design layout. In this example, a disjoint set 2145 is displayed in the error path shape display area 2120. The disjoint set 2145 includes eight shapes. There is a link between two shapes if they are pitch constrained. The shapes 2125 and 2130 are pre-assigned with a first color (illustrated in the figure as lined gray) and the shapes 2135 and 2140 are pre-assigned with a second color (illustrated in the figure as solid gray). This means the designer has pre-assigned the shapes 2125 and 2130 to a first mask and the shapes 2135 and 2140 to a second different mask.

As illustrated in the first stage 2105, there are four error path shapes 2151-2154 displayed in the error path shape display area 2120. The error path shape 2151 indicates a color-seeding violation and the error path between the nodes 2125 and 2130. The error path shape 2152 indicates a color-seeding violation and the error path between the nodes 2125 and 2140. The error path shape 2153 indicates a color-seeding violation and the error path between the nodes 2130 and 2135. The error path shape 2154 indicates a color-seeding violation and the error path between the nodes 2135 and 2140. In the first stage 2105, the GUI 2100 displays all error path shapes, overlapped or non-overlapped. For instance, the error path shapes 2151 and 2154 crosses each other, thus are overlapped error path shapes. The error path shapes 2152 and 2153 does not crosses another error path shape, thus are non-overlapped error path shapes. A user can click the button 2160 to switch the GUI 2100 to display non-overlapped error paths only.

The second stage 2110 illustrates the GUI 2100 after it has been switched to display non-overlapped error paths only. There are two list items, Error Path 2 and 3, listed in the error path list pane 2115. The error path list pane 2115 also includes a button 2165 that will switch the GUI 2100 to show all error paths when clicked. Error Path 1 and 4 have been removed from the list because they are overlapped error paths. In the second stage 2110, there are two error path shapes 2152 and 2153 displayed in the error path shape display area 2120. The error path shapes 2151 and 2154 are not displayed because they are overlapped error path shapes. A user can click the button 2165 to switch the GUI 2100 back to display all error paths. Displaying non-overlapped error paths provides a simplified view, thus might be desirable in some embodiments.

One of ordinary skill in the art will recognize that the GUI 2100 is a conceptual representation of the operations used to switching between different color-seeding violation display modes. The specific operations and/or elements of the GUI need not in the exact form as shown and described. For example, the GUI 2100 may include more element and controls, e.g., radio buttons, toggle buttons, etc., to perform the operations.

V. Electronic System

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 22:
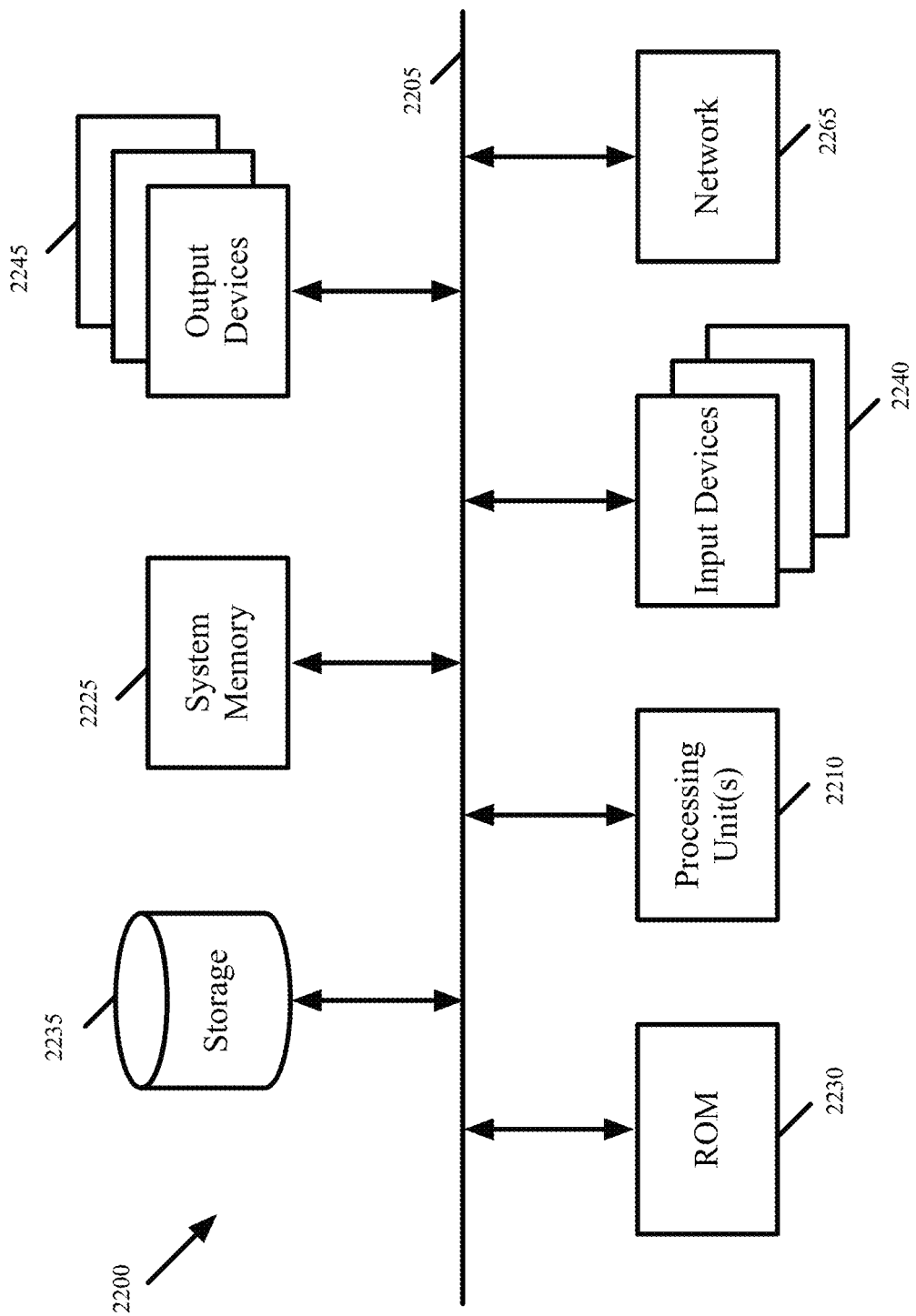
FIG. 22 conceptually illustrates an electronic system with which some embodiments of the invention are implemented.

FIG. 22 conceptually illustrates an electronic system 2200 with which some embodiments of the invention are implemented. The electronic system 2200 can be used to execute any of the control, virtualization, or operating system applications described above. The electronic system 2200 may be a computer (e.g., a desktop computer, personal computer, tablet computer, server computer, mainframe, a blade computer etc.), phone, PDA, or any other sort of electronic device. Such an electronic system includes various types of computer readable media and interfaces for various other types of computer readable media. Electronic system 2200 includes a bus 2205, processing unit(s) 2210, a system memory 2225, a read-only memory 2230, a permanent storage device 2235, input devices 2240, and output devices 2245.

The bus 2205 collectively represents all system, peripheral, and chipset buses that communicatively connect the numerous internal devices of the electronic system 2200. For instance, the bus 2205 communicatively connects the processing unit(s) 2210 with the read-only memory 2230, the system memory 2225, and the permanent storage device 2235.

From these various memory units, the processing unit(s) 2210 retrieves instructions to execute and data to process in order to execute the processes of the invention. The processing unit(s) may be a single processor or a multi-core processor in different embodiments.

The read-only-memory (ROM) 2230 stores static data and instructions that are needed by the processing unit(s) 2210 and other modules of the electronic system. The permanent storage device 2235, on the other hand, is a read-and-write memory device. This device is a non-volatile memory unit that stores instructions and data even when the electronic system 2200 is off. Some embodiments of the invention use a mass-storage device (such as a magnetic or optical disk and its corresponding disk drive) as the permanent storage device 2235.

Other embodiments use a removable storage device (such as a floppy disk, flash drive, etc.) as the permanent storage device. Like the permanent storage device 2235, the system memory 2225 is a read-and-write memory device. However, unlike storage device 2235, the system memory is a volatile read-and-write memory, such a random access memory. The system memory stores some of the instructions and data that the processor needs at runtime. In some embodiments, the invention's processes are stored in the system memory 2225, the permanent storage device 2235, and/or the read-only memory 2230. For example, the various memory units include instructions for processing multimedia clips in accordance with some embodiments. From these various memory units, the processing unit(s) 2210 retrieves instructions to execute and data to process in order to execute the processes of some embodiments.

The bus 2205 also connects to the input and output devices 2240 and 2245. The input devices enable the user to communicate information and select commands to the electronic system. The input devices 2240 include alphanumeric keyboards and pointing devices (also called "cursor control devices"). The output devices 2245 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 22, bus 2205 also couples electronic system 2200 to a network 2265 through a network adapter (not shown). In this manner, the computer can be a part of a network of computers (such as a local area network ("LAN"), a wide area network ("WAN"), or an Intranet, or a network of networks, such as the Internet. Any or all components of electronic system 2200 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. For example, while the examples shown illustrate splitting one or more shapes of a design layout region into two exposures, one of ordinary skill in the art would recognize that some embodiments would use similar processes to split shapes of a design layout region into more than two (e.g., three, four, etc.) exposures. One of ordinary skill in the art will also recognize that in some instances above, when referring to assigning shapes or portions of shapes to multiple exposures, the shapes (or portions thereof) are actually assigned to multiple mask layouts that are used to create multiple masks that enable a design layout layer to be printed in multiple exposures. Similarly, one of ordinary skill would recognize that while many instances above refer to "drawing" a graph, some embodiments do not actually draw the visible graph, but instead define the graph as a data structure.

In addition, a number of the figures (including FIGS. 9, 11, 14, 17, and 19) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details.

What is claimed is:

1. A non-transitory machine readable medium storing a program for displaying markers for assignment conflicts for shapes in a circuit design layout that are pre-assigned to different masks, the program comprising sets of instructions for:
   receiving a layer of the design layout comprising a plurality of pre-assigned shapes;
   identifying a set of initial search shapes from the plurality of pre-assigned shapes in a disjoint set;
   identifying a search path from an initial search shape, which has been identified, to a remaining pre-assigned shape in the disjoint set;
   performing an analysis on the layer to identify a plurality of error paths by identifying at least one hole in the layer using at least a number of links connecting shapes along a path, wherein
      an error path comprises the path that connects two pre-assigned shapes that exhibit an assignment conflict, the at least one hole borders and is enclosed by at least the two pre-assigned shapes and at least some links of the number of links, the two pre-assigned shapes have been preassigned to a same photomask or two different photomasks, and the at least some links of the number of links in the at least one hole connect two or more shapes in the layer;
   determining whether the initial search shape and the remaining pre-assigned shape connected by the search path exhibit an assignment conflict;
   adding the search path into the plurality of error paths; and
   displaying a marker for at least one error path of the plurality of error paths in order to visually aid a user to resolve assignment conflicts.

2. The non-transitory machine readable medium of claim 1, wherein a path comprises a set of links including the number of links, wherein a link connects two shapes within a threshold distance from each other.

3. The non-transitory machine readable medium of claim 2, wherein the threshold distance comprises a minimum same color spacing, and the error path is identified based in part or in whole upon parity information of the number of links along the path.

4. The non-transitory machine readable medium of claim 2, wherein the two shapes exhibit the assignment conflict when there are an odd number of links on the path between the two shapes assigned to a same mask.

5. The non-transitory machine readable medium of claim 2, wherein the two shapes exhibit the assignment conflict when there are an even number of links on the path between the two shapes assigned to different masks.

6. The non-transitory machine readable medium of claim 2, wherein the set of instructions for performing the analysis further comprises instructions for:
   identifying a disjoint set of shapes in which each two shapes in the disjoint set are connected to each other by at least one path;
   determining whether the disjoint set has two or more pre-assigned shapes; and
   when the disjoint set is determined to have two or more pre-assigned shapes, identifying a set of error paths within the disjoint set, wherein an error path connects two pre-assigned shapes that exhibit the assignment conflict.

7. The non-transitory machine readable medium of claim 6, wherein the set of error paths comprises all paths between pre-assigned shapes in the disjoint set of shapes that exhibit the assignment conflict.

8. The non-transitory machine readable medium of claim 6, wherein the set of instructions for performing the analysis further comprises instructions for, for a first error path that has been identified in the set of error paths, specifying the first error path as a non-display error path when the first error path crosses another error path in the set of error paths.

9. The non-transitory machine readable medium of claim 8, wherein the non-display error path is not displayed with the marker when the program is configured to display non-overlapped paths only.

10. The non-transitory machine readable medium of claim 1, wherein the set of instructions for determining whether the initial search shape and the remaining pre-assigned shape connected by the search path exhibit the assignment conflict further comprises instructions for using a breadth-first search.

11. The non-transitory machine readable medium of claim 1, wherein the set of instructions for identifying the set of initial search shapes further comprises instructions for:
    assigning one or more shapes in the disjoint set to a first mask based at least in part on a first assignment scheme;
    assigning the one or more shapes in the disjoint set to a second mask based at least in part on a second assignment scheme;
    selecting an assignment scheme from the first assignment scheme and the second assignment scheme based at least in part on respective numbers of assignment errors caused by the first assignment scheme and the second assignment scheme; and
    identifying, as the set of initial search shapes, pre-assigned shapes that do not conform to their respective mask designations assigned by the assignment scheme.

12. The non-transitory machine readable medium of claim 11, wherein the first assignment scheme and the second assignment scheme assign the one or more shapes to the first mask or the second mask based on a breadth-first search.

13. The non-transitory machine readable medium of claim 12, where a root of the breadth-first search is assigned to the first mask via the first assignment scheme and the root is assigned to the second different mask via the second assignment scheme.

14. The non-transitory machine readable medium of claim 11, wherein an assignment error occurs when a pre-assigned shape is assigned to a mask that is different from a pre-assigned mask.

15. The non-transitory machine readable medium of claim 11, wherein the set of instructions for selecting one of the first assignment scheme and the second assignment scheme comprises further instructions for selecting the assignment scheme that causes fewer assignment errors.

16. The non-transitory machine readable medium of claim 1, wherein the marker is for indicating that a pair of pre-assigned shapes associated with the marker exhibit the assignment conflict.

17. A system comprising:
    a processor for executing sets of instructions; and
    a memory for storing a program for displaying assignment conflicts for pre-assigned shapes in a circuit design layout, the program comprising a set of instructions which, when executed by the processor, cause the processor to:
    receive a layer of the design layout comprising a plurality of pre-assigned shapes;
    identify a set of initial search shapes from the plurality of pre-assigned shapes in a disjoint set;
    identify a search path from an initial search shape, which has been identified, to a remaining pre-assigned shape in the disjoint set;
    perform an analysis on the layer to identify a plurality of error paths by identifying at least one hole in the layer using at least a number of links connecting shapes along a path, wherein an error path comprises the path that connects two pre-assigned shapes that have an assignment conflict, the at least one hole borders and is enclosed by at least the two pre-assigned shapes and at least some links of the number of links, the two pre-assigned shapes have been preassigned to a same photomask or two different photomasks, and the at least some links of the number of links in the at least one hole connect two or more shapes in the layer;
    determine whether the initial search shape and the remaining pre-assigned shape connected by the search path exhibit an assignment conflict;
    add the search path into the plurality of error paths; and
    display a marker for at least one error path of the plurality of error paths in order to visually aid a user to resolve assignment conflicts.

18. The system of claim 17, wherein a path comprises a set of links including the number of links, wherein a link connects two shapes within a threshold distance from each other.

19. The system of claim 18, wherein the set of instructions for performing the analysis comprises sets of instructions for:
    identifying a disjoint set of shapes in which each two shapes in the disjoint set are connected to each other by at least one path;
    determining whether the disjoint set has two or more pre-assigned shapes; and
    when the disjoint set is determined to have two or more pre-assigned shapes, identifying a set of error paths within the disjoint set, wherein an error path connects two pre-assigned shapes that exhibit the assignment conflict.

20. The system of claim 19, wherein the set of instructions for performing the analysis further comprises instructions for, for a first error path that has been identified in the set of error paths, specifying the first error path as a non-display error path when the first error path crosses another error path in the set of error paths.

21. The system of claim 18, wherein the two shapes exhibit the assignment conflict when there are an odd number of links on the path between the two shapes pre-assigned to a same mask.

22. The system of claim 18, wherein the two shapes exhibit the assignment conflict when there are an even number of links on the path between two shapes pre-assigned to different masks.

23. A computer-implemented method for displaying assignment conflicts for pre-assigned shapes in a circuit design layout, the method comprising:
    executing a sequence of instructions by using a processor of a computing system to perform a process, the process comprising:
    receiving a layer of the design layout comprising a plurality of pre-assigned shapes;
    identifying a set of initial search shapes from the plurality of pre-assigned shapes in a disjoint set;
    identifying a search path from an initial search shape, which has been identified, to a remaining pre-assigned shape in the disjoint set;
    performing an analysis on the layer to identify a plurality of error paths by identifying at least one hole in the layer using at least a number of links connecting shapes along a path, wherein an error path comprises the path that connects two pre-assigned shapes that have an assignment conflict, the at least one hole borders and is enclosed by at least the two pre-assigned shapes and at least some links of the number of links, the two pre-assigned shapes have been preassigned to a same photomask or two different photomasks, and the at least some links of the number of links in the at least one hole connect two or more shapes in the layer;
    determining whether the initial search shape and the remaining pre-assigned shape connected by the search path exhibit an assignment conflict;
    adding the search path into the plurality of error paths; and displaying a marker for at least one error path of the plurality of error paths in order to visually aid a user to resolve assignment conflicts.

24. The method of claim 23, wherein a path comprises a set of links including the number of links, wherein a link connecting two shapes within a threshold distance from each other.

25. The method of claim 24, wherein performing the analysis comprises:
identifying a disjoint set of shapes in which each two shapes in the disjoint set are connected to each other by at least one path;
determining whether the disjoint set has two or more pre-assigned shapes; and
when the disjoint set is determined to have two or more pre-assigned shapes, identifying a set of error paths within the disjoint set, wherein an error path connects two pre-assigned shapes that exhibit the assignment conflict.

26. The method of claim 23, wherein the initial search path is identified based at least in part on a breadth-first search.

27. The method of claim 23, wherein identifying the set of initial search shapes comprises:
assigning one or more shapes in the disjoint set to a first mask based at least in part on a first assignment scheme;
assigning the one or more shapes in the disjoint set to a second mask based at least in part on a second assignment scheme;
selecting an assignment scheme from the first assignment scheme and the second assignment scheme based at least in part on respective numbers of assignment errors caused by the first assignment scheme and the second assignment scheme; and
identifying, as the set of initial search shapes, pre-assigned shapes that do not conform to their mask designations assigned by the assignment scheme.

28. The method of claim 27, wherein the first assignment scheme and the second assignment scheme are used to assign the one or more shapes to the first mask or to the second mask based at least in part on a breadth-first search.

29. The method of claim 23, wherein an assignment error occurs when a pre-assigned shape is assigned to a mask that is different from a pre-assigned mask.

* * * * *